(12) United States Patent
Hwang et al.

(10) Patent No.: US 11,982,688 B2
(45) Date of Patent: *May 14, 2024

(54) SPRING CONTACT AND TEST SOCKET WITH SAME

(71) Applicant: HICON CO., LTD., Gyeonggi-do (KR)

(72) Inventors: Dong Weon Hwang, Gyeonggi-do (KR); Logan Jae Hwang, Flower Mound, TX (US); Jae Baek Hwang, Seoul (KR)

(73) Assignee: HICON CO., LTD., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/973,155

(22) Filed: Oct. 25, 2022

(65) Prior Publication Data

US 2023/0043825 A1 Feb. 9, 2023

Related U.S. Application Data

(62) Division of application No. 16/865,821, filed on May 4, 2020, now Pat. No. 11,561,241.

(30) Foreign Application Priority Data

Oct. 2, 2019 (KR) .......................... 10-2019-0122622

(51) Int. Cl.
*G01R 1/04* (2006.01)
*G01R 1/067* (2006.01)
(Continued)

(52) U.S. Cl.
CPC ....... *G01R 1/06722* (2013.01); *G01R 1/0466* (2013.01); *G01R 31/2863* (2013.01); *G01R 31/2886* (2013.01)

(58) Field of Classification Search
CPC .......... G01R 1/04; G01R 1/067; G01R 1/073; G01R 31/28; G01R 31/2863;
(Continued)

(56) References Cited

U.S. PATENT DOCUMENTS 6,278,284 B1 8/2001 Mori et al.
6,768,331 B2 7/2004 Longson et al.
(Continued)

FOREIGN PATENT DOCUMENTS

EP 2860533 A1 4/2015
EP 3255738 A1 12/2017
(Continued)

OTHER PUBLICATIONS

The International Search Report of the International Searching Authority, issued by ISA/KR in connection with PCTKR/2019/017865 dated Jun. 30, 2020.
(Continued)

*Primary Examiner* — Neel D Shah
(74) *Attorney, Agent, or Firm* — Levenfeld Pearlstein, LLC

(57) ABSTRACT

The present invention relates to a test socket having a thin structure that can reduce durability degradation of a contact itself, have excellent electrical characteristics in processing high-speed signals, and can extend a service life thereof, and relates to spring contacts suitable thereto. The test socket according to the present invention includes: a plurality of spring contacts (100) each of which includes an upper contact pin (110) and a lower contact pin (120) that are assembled cross each other, and a spring (130) supporting the upper and lower contact pins (110 and 120); a main plate (1110) having a plurality of accommodating holes (1111) in which the respective spring contacts (100) are accommodated, with first openings (1113); and a film plate (1120)
(Continued)

provided on a lower portion of the main plate (1110), and having second openings (1121).

2 Claims, 39 Drawing Sheets

(51) Int. Cl.
    *G01R 1/073*     (2006.01)
    *G01R 31/28*     (2006.01)

(58) Field of Classification Search
    CPC .... G01R 31/2886; H01R 13/03; H01R 13/08; H01R 13/24
    See application file for complete search history.

(56) References Cited

U.S. PATENT DOCUMENTS

| | | | |
|---|---|---|---|
| 9,696,344 | B2 | 6/2017 | Lee |
| 11,561,241 | B2 * | 1/2023 | Hwang ............... G01R 1/06722 |
| 2007/0269999 | A1 | 11/2007 | Di Stefano |
| 2012/0238136 | A1 | 9/2012 | Hwang |
| 2015/0126081 | A1 | 5/2015 | Oda |
| 2017/0317332 | A1 | 11/2017 | DeKeuster et al. |
| 2018/0275167 | A1 | 9/2018 | Nagata |
| 2018/0340957 | A1 | 11/2018 | Teranishi et al. |
| 2018/0348256 | A1 | 12/2018 | Hwang |
| 2018/0376610 | A1 | 12/2018 | Kawabata |
| 2019/0008048 | A1 | 1/2019 | Sano |
| 2019/0131728 | A1 | 5/2019 | Mardi |
| 2019/0173217 | A1 | 6/2019 | Miura |

FOREIGN PATENT DOCUMENTS

| | | |
|---|---|---|
| EP | 3425745 A1 | 1/2019 |
| EP | 3444620 A1 | 2/2019 |
| JP | 2004309490 A | 11/2004 |
| JP | 2014154265 A | 8/2014 |
| JP | 2018529932 A | 10/2018 |
| KR | 20110085823 A | 7/2011 |
| KR | 20120066386 A | 6/2012 |
| KR | 20140034430 A | 3/2014 |
| KR | 20170066007 A | 6/2017 |
| KR | 101860923 B1 | 5/2018 |
| KR | 20180085103 A | 7/2018 |
| KR | 101930866 B1 | 12/2018 |
| TW | M376001 U | 3/2010 |
| TW | M394594 U | 12/2010 |
| TW | 201409852 A | 3/2014 |

OTHER PUBLICATIONS

The Written Opinion of the International Searching Authority, issued by ISA/KR in connection with PCTKR/2019/017865 dated Jun. 30, 2020.

The International Preliminary Report on Patentability issued by WIPO and ISA/KR in connection with PCTKR/2019/017865 dated Apr. 5, 2022.

Extended European Search Report issued by the EPO in relation to EP19948172.2 dated Oct. 31, 2023.

* cited by examiner

SPRING CONTACT AND TEST SOCKET WITH SAME

CROSS REFERENCE TO RELATED APPLICATION

The present application is a divisional application of U.S. application Ser. No. 16/865,821 filed May 4, 2020, which claims the benefit of and priority to Korean Application No. 10-2019-0122622, filed Oct. 2, 2019, the entire contents of which is incorporated herein for all purposes by this reference.

BACKGROUND OF THE INVENTION

Field of the Invention

The present invention relates generally to a spring contact and a test socket with the same. More particularly, the present invention relates to spring contacts that electrically connects each of a plurality of leads of an integrated circuit (IC) to an associated one of a plurality of pads of a printed circuit board (PCB) for the test of the performance of the IC or electrically connects each of the leads of an IC of a CPU to a PCB of an electronic appliance such as a personal computer (PC) or a mobile phone, and relates to a test socket with the same.

Description of the Related Art

In general, spring contacts serve to electrically connect a PCB with leads of an IC, and are essential components of a socket for testing ICs.

FIGS. 1A to 3B illustrate spring contacts in the related art, and FIGS. 4 and 5 illustrate a socket with spring contacts.

FIGS. 1A and 1B are respectively a perspective view and an exploded perspective view illustrating spring contacts in the related art. The spring contact includes an upper contact pin 10, a lower contact pin 20 assembled to the upper contact pin 10 in such a manner that the upper and lower contact pins cross each other in longitudinal directions thereof, and a spring 30 fitted over the upper and lower contact pins 10 and 20 at a position therebetween to elastically support the upper and lower contact pins 10 and 20.

FIGS. 2A and 2B are respectively a plan view illustrating the upper contact pin in the related art and a sectional view taken along line A-A. The upper contact pin 10 includes a contact portion 11 protruding from an upper end of the upper contact pin, a pair of fixing protrusions 12 protruding from left and right sides of the upper contact pin, a body portion 13 including a flow groove 13a recessed in a longitudinal direction thereof, a pair of elastic portions 14 extending symmetrically from the body portion 13, and a locking protrusion 15 provided at an end of each of the elastic portions 14. Meanwhile, the lower contact pin has the same shape as the upper contact pin.

FIGS. 3A and 3B are respectively views illustrating an operation example of the spring contact in the related art, in which the left and right views of FIG. 3A illustrate respectively before and after compression of the spring, and the left and right views of FIG. 3B illustrate in plan view the position between the upper and lower contact pins before and after the compression of the spring.

Referring to FIGS. 3A and 3B, the upper contact pin 10 and the lower contact pin 20 are assembled together with the spring 30 fitted thereover in such a manner that the elastic portions 14 and 24 are perpendicular to each other in the longitudinal directions of the contact pins. In detail, the respective locking protrusions 15 of the upper contact pin 10 are inserted into a flow groove 23a of the lower contact pin 20 and locking protrusions 25 of the lower contact pin 20 are inserted into the flow groove 13a of the upper contact pin 10. Therefore, when an external force acts in a longitudinal direction of the spring contact, the locking protrusions 15 and 25 are moved along the flow grooves 13a and 23a while the upper contact pin 10 and the lower contact pin 20 are compressed by a certain length S.

Referring to FIG. 3A, the maximum displacement (Smax) between the upper contact pin 10 and the lower contact pin 20 is determined by the position (left view) where the locking protrusions 15 and 25 of the upper and lower contact pins 10 and 20 are supported at the ends of the opposing flow grooves 13a and 23a before the spring is compressed, and the position (right view) where end portions 13b and 23b of the bodies 13 and 23 of the upper and lower contact pins 10 and 20 come into contact with each other in a compressed state of the spring.

FIG. 4 is a plan view illustrating the socket in the related art, and FIG. 5 is a sectional view taken along line B-B of FIG. 4.

Referring to FIGS. 4 and 5, the socket in the related art includes an upper plate 40 and a lower plate 50 assembled to the upper plate 40 by fitting, with spring contacts 1 fixed between the upper plate 40 and the lower plate 50.

The upper plate 40 and the lower plate 50 include respectively receiving holes 41 and 51 to which the spring contact 1 is fixed. The spring contact 1 is located in the receiving holes 41 and 51 between the upper and lower plates 40 and 50 such that upper and lower ends thereof protrude outside the receiving holes 41 and 51, and serves to electrically connect a lead of an IC and a pad of a PCB to each other.

The socket in the related art is manufactured in such a manner that the upper and lower plates are made of synthetic resin. In particular, at the upper plate 40, a flange portion 42 in which the first receiving hole 41 is formed is provided by protruding from the upper plate 40 by a predetermined height such that the spring contact 1 of a predetermined height is received therein.

Therefore, in a manufacturing a thin-type plate having the above flange portion in which the first receiving hole by injection molding with synthetic resin, a high processing cost is required. Also, there is a limitation in manufacturing a plate having a thickness of equal to or less than 1.0 mm, and, due thereto, it is difficult to manufacture a test socket for high speed use for processing a high-speed signal of equal to or greater than 40 GHz.

On the other hand, as another related art technology, a rubber-type socket is used. The rubber socket may include a stretchable insulating body having an insulating silicone powder solidified therein, and a conductive silicone portion formed in the insulating body by vertically passing therethrough at a position corresponding to a lead of an IC.

The rubber-type socket may be manufactured in such a manner that when a silicone mixture containing insulating silicone and conductive powder in a predetermined ratio is placed into a mold and a strong magnetic field is formed at a position where the conductive silicone portion is to be formed, the conductive powder of the silicon mixture is collected at the position where the magnetic field is formed and finally a molten silicone mixture is solidified to form an array of conductive silicone portions in the insulating body.

The rubber-type socket is disadvantageous in that the speed of elastic response may be slower than that of a pin-type contact (spring contact) and the elasticity may be lost in the course of a repeated test process, which may result in a short service life and increased costs due to frequent replacement. In addition, due to the characteristics that the elasticity persistence decreases over time, the elastic repulsive force may become zero or remarkably low during continuous compression test for a long period of time (more than one week), and thus a short circuit may occur, which may make it difficult to use the rubber-type socket for long term testing.

Moreover, the rubber-type socket is problematic in that the elastic characteristics may be affected greatly by the temperature, and the uniformity of the resistance characteristics of the individual conductive silicone portions may be inferior.

The foregoing is intended merely to aid in the understanding of the background of the present invention, and is not intended to mean that the present invention falls within the purview of the related art that is already known to those skilled in the art.

DOCUMENTS OF RELATED ART (Patent document 1) Korean Patent Application Publication No. 10-2011-0051668 (published on May 18, 2011)

SUMMARY OF THE INVENTION

Accordingly, the present invention has been made keeping in mind the above problems occurring in the related art, and an objective of the present invention is to provide a socket having a thin structure that can reduce durability degradation of a contact itself, have excellent electrical characteristics in processing high-speed signals, and can extend a service life thereof, and to provide a spring contact suitable thereto.

In order to achieve the above objective, according to one aspect of the present invention, there is provided a test socket with spring contacts, the test socket including: a plurality of spring contacts each of which includes an upper contact pin, and a lower contact pin assembled to the upper contact pin such that the upper and lower contact pins cross each other to mutually linearly operate, and a spring elastically supporting the upper contact pin and the lower contact pin; a main plate having a plurality of accommodating holes in which the respective spring contacts are accommodated, with first openings each having a diameter d2 smaller than a diameter d1 of each of the accommodating holes formed to support each of the respective upper contact pins by a stepped portion protruding horizontally from an upper opening end of each of the accommodating holes; and a film plate provided on a lower portion of the main plate, and having second openings that each at a position corresponding to each of the accommodating holes to have a diameter d3 smaller than the diameter d1 of the accommodating hole to support each of the respective lower contact pins.

According to another aspect of the present invention, there is provided a test socket with spring contacts, the test socket including: a plurality of spring contacts each of which includes an upper contact pin, and a lower contact pin assembled to the upper contact pin such that the upper and lower contact pins cross each other to mutually linearly operate, and a spring elastically supporting the upper contact pin and the lower contact pin; a main plate having a plurality of accommodating holes in which the respective spring contacts are accommodated, with first openings each having a diameter d2 smaller than a diameter d1 of each of the accommodating holes formed to support each of the respective upper contact pins by a stepped portion protruding horizontally from an upper opening end of each of the accommodating holes; and a silicone caulking part inserted into a lower opening end of each of the accommodating holes to fix each of the respective lower contact pins to the main plate.

According to still another aspect of the present invention, there is provided a test socket with built-in contacts, the test socket including: a plurality of spring contacts each of which includes an upper contact pin, and a lower contact pin assembled to the upper contact pin such that the upper and lower contact pins cross each other to mutually linearly operate, and a spring elastically supporting the upper contact pin and the lower contact pin; a lower film plate having a plurality of first through-holes through which the respective spring contacts are positioned; a mounting part provided on an upper side of the lower film plate; an insulating body provided on an upper side of the mounting part and having second through-holes formed corresponding to the first through-holes to accommodate the spring contacts; an upper film plate provided on an upper surface of the insulating body and having third through-holes formed corresponding to the second through-holes; and a first silicone caulking part inserted into an upper portion of each of the second through-holes of the insulating body to fix each of the respective upper contact pins to the insulating body.

According to still another aspect of the present invention, there is provided a test socket with built-in spring contacts, the test socket including: a plurality of spring contact each of which is integrally formed in such a manner that a strip pattern formed by punching out a metal plate is rolled into a cylindrical shape; a lower film plate having a plurality of first through-holes through which the respective spring contacts are positioned; a mounting part provided on an upper side of the lower film plate; an insulating body provided on an upper side of the mounting part and having second through-holes that are formed corresponding to the first through-holes to accommodate the spring contacts; an upper film plate provided on an upper surface of the insulating body and having third through-holes formed corresponding to the second through-holes; and a first silicone caulking part inserted into an upper portion of each of the second through-holes of the insulating body to fix an upper end of each of the spring contacts to the insulating body.

According to still another aspect of the present invention, there is provided a spring contact, including: a first contact pin; a second contact pin assembled to the first contact pin such that the first and second contact pins cross each other; and a coil spring elastically supporting the first contact pin and the second contact pin, wherein each of the first contact pin and the second contact pin includes: a body portion including a groove that is recessed in each of opposite surfaces thereof in a longitudinal direction thereof; a pair of shoulder protrusions protruding from each of left and right side ends of the body portion to support the coil spring; a first end contact portion extending from an upper end of the body portion; a pair of elastic portions extending in the longitudinal direction of the body portion to be bilaterally symmetrical to each other, and each of which includes a guide surface protruding inward from an end portion of each of the elastic portions such that the respective guide surfaces face each other; and a second end contact portion extending from an end of each of the elastic portions, wherein at least one of the first end contact portion and the second end contact portion includes a head portion formed at the upper end of the body portion and made of a plate-shaped strip, the strip having same left and right lengths with respect to of a center of the body portion, with an upper end along which the first end contact portion is formed, and the strip includes a first strip section located on the same plane as the body portion and provided to have the same left and right distances from the center of the body portion, and a second strip section rolled at each of opposite ends of the first strip section to have a semi-circular arc shape, such that the first strip section is located in a radial direction of a cylindrical shape formed by the entire second strip section.

The test socket according to the present invention has a structure with spring contacts and can be manufactured in a thin structure, and thus has an effect of being excellent in processing high-speed signals and of extending a service life thereof.

In addition, the spring contact according to the present invention has an effect of reducing the contact resistance in consideration of the shape of a lead of an IC, while having a structure suitable for the test socket of the thin structure.

BRIEF DESCRIPTION OF THE DRAWINGS

The above and other objectives, features, and other advantages of the present invention will be more clearly understood from the following detailed description when taken in conjunction with the accompanying drawings, in which.

DETAILED DESCRIPTION OF THE INVENTION

All terms or words used in the specification and claims have the same meaning as commonly understood by one of ordinary skill in the art to which inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Accordingly, one or more embodiments and configurations illustrated in drawings are only exemplary embodiments, and do not represent all technical aspects of the present invention. Thus, it should be understood that there may be various equivalents and changes capable of replacing the one or more exemplary embodiments.

Hereinafter, exemplary embodiments of the present invention will be described in detail with reference to the accompanying drawings.

First Embodiment

Figure 1A:
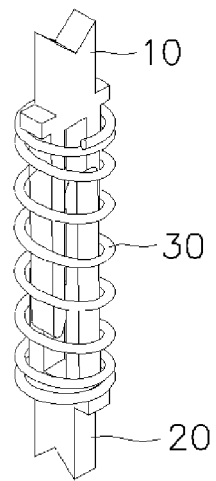
FIGS. 1A and 1B are respectively a perspective view and an exploded perspective view illustrating a spring contact in the related art.
Figure 1B:
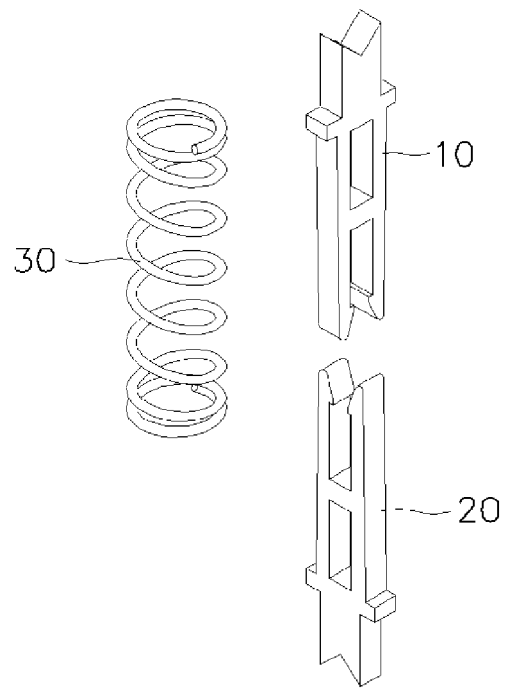
Figure 2A:
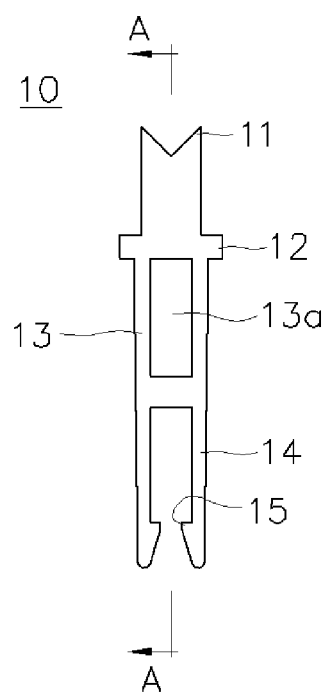
FIGS. 2A and 2B are respectively a plan view illustrating an upper contact pin in the related art and a sectional view taken along line A-A.
Figure 2B:
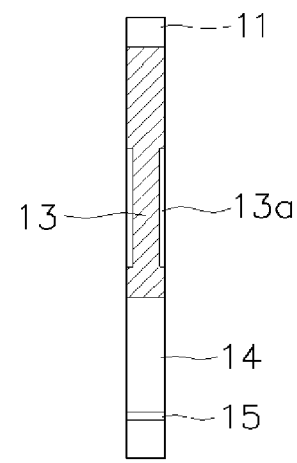
Figure 3A:
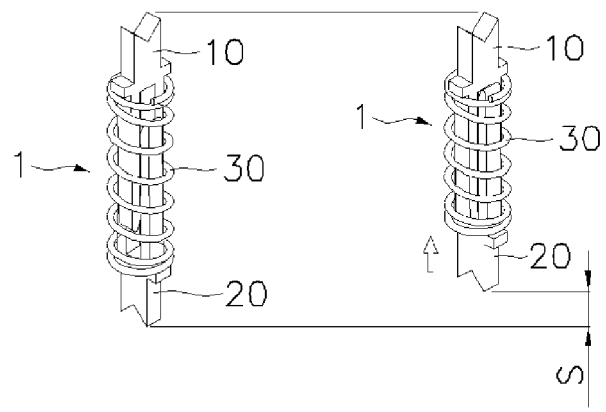
FIGS. 3A and 3B are views illustrating an operation example of the spring contact in the related art.
Figure 3B:
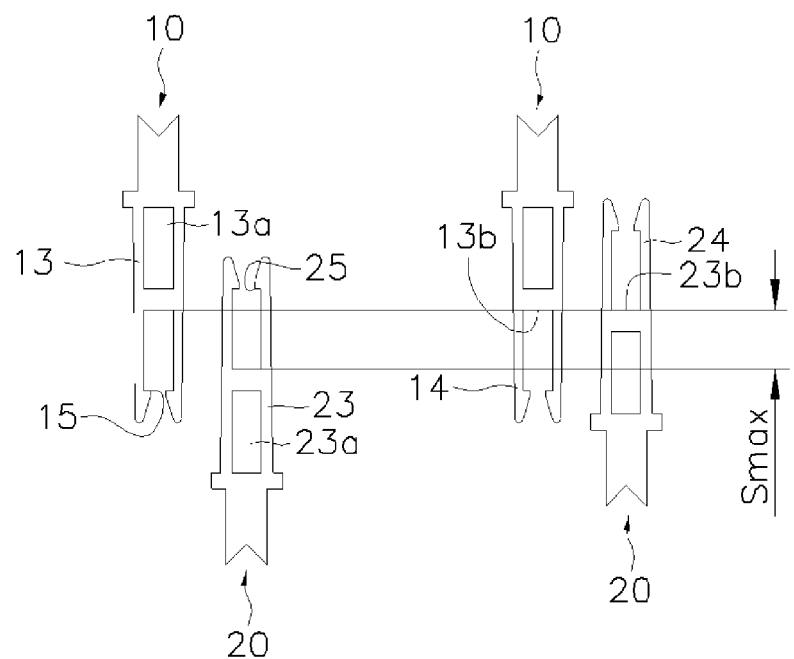
Figure 4:
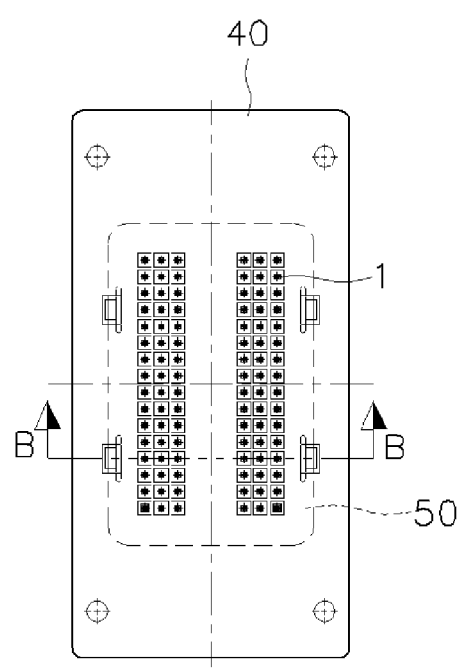
FIG. 4 is a plan view illustrating a socket in the related art.
Figure 5:
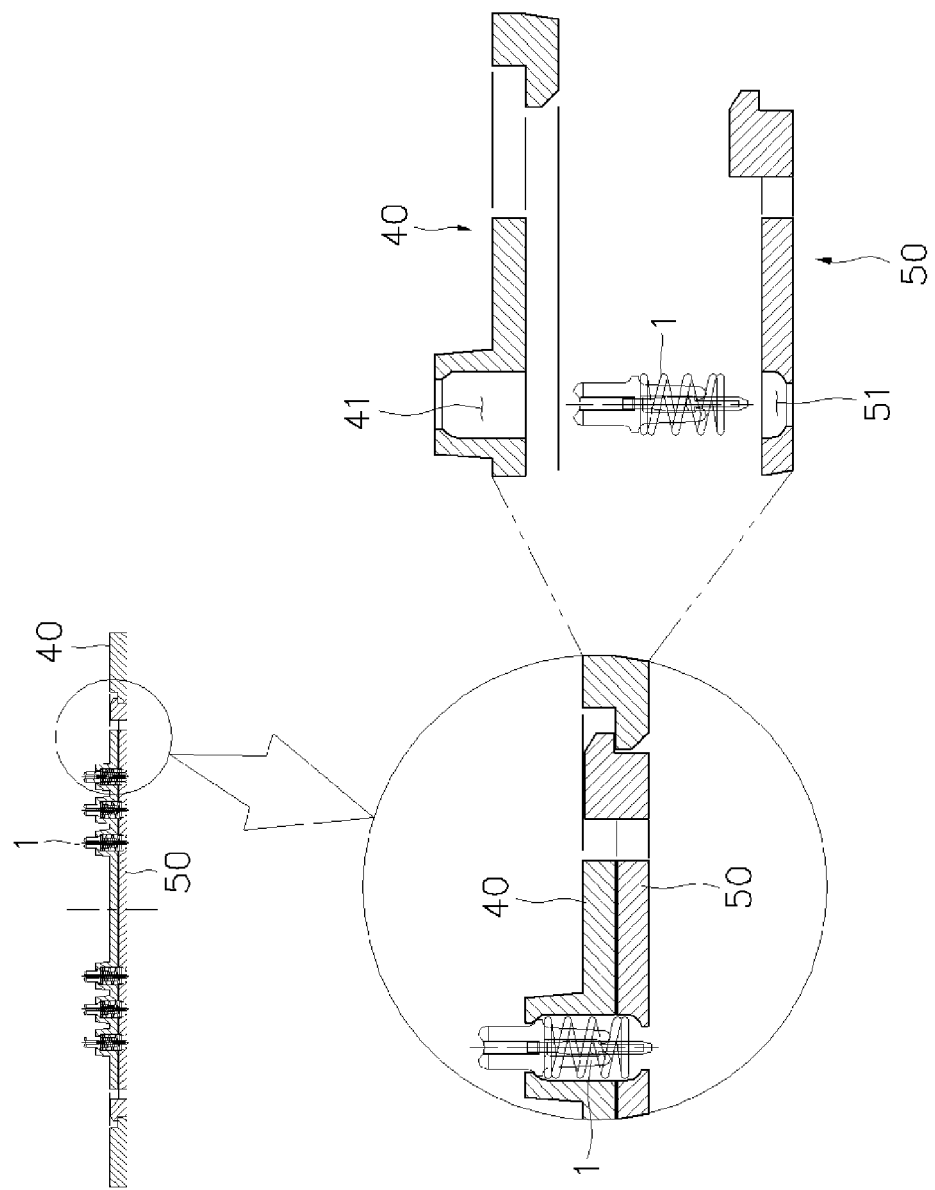
FIG. 5 is a sectional view taken along line B-B in FIG. 4.
Figure 6:
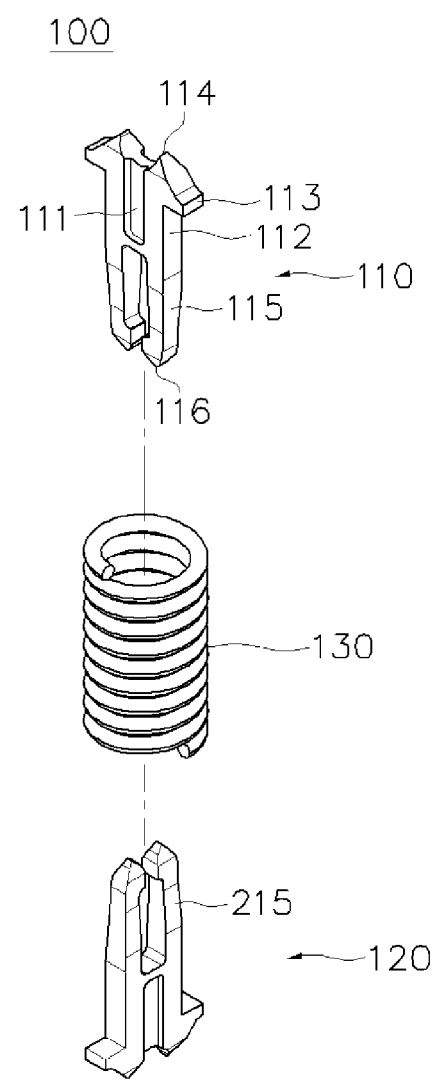
FIG. 6 is an exploded perspective view illustrating a spring contact according to an embodiment of the present invention.

FIG. 6 is an exploded perspective view illustrating a spring contact according to a first embodiment of the present invention. A spring contact 100 of the present embodiment includes an upper contact pin 110, a lower contact pin 120 assembled to the upper contact pin 110 such that the upper and lower contact pins 110 and 120 cross each other, and a spring 130 elastically supporting the upper and lower contact pins 110 and 120.

In particular, the upper contact pin 110 and the lower contact pin 120 according to the present invention are provided by the use of contact pins having the same size and shape. Two contact pins 110 and 120 assembled to cross each other in longitudinal directions thereof are divided into upper and lower contact pins depending on the assembly position. Therefore, in the following description, the upper contact pin 110 will be described mainly.

The spring 130 is provided by the use of a coiled compression spring that resists the compressive force. The spring 130 is provided between the upper contact pin 110 and the lower contact pin 120 to provide a restoring force for returning the upper contact pin 110 and the lower contact pin 120 to original positions thereof when the upper contact pin 110 and the lower contact pin 120 are compressed in the longitudinal directions thereof.

Figure 7A:
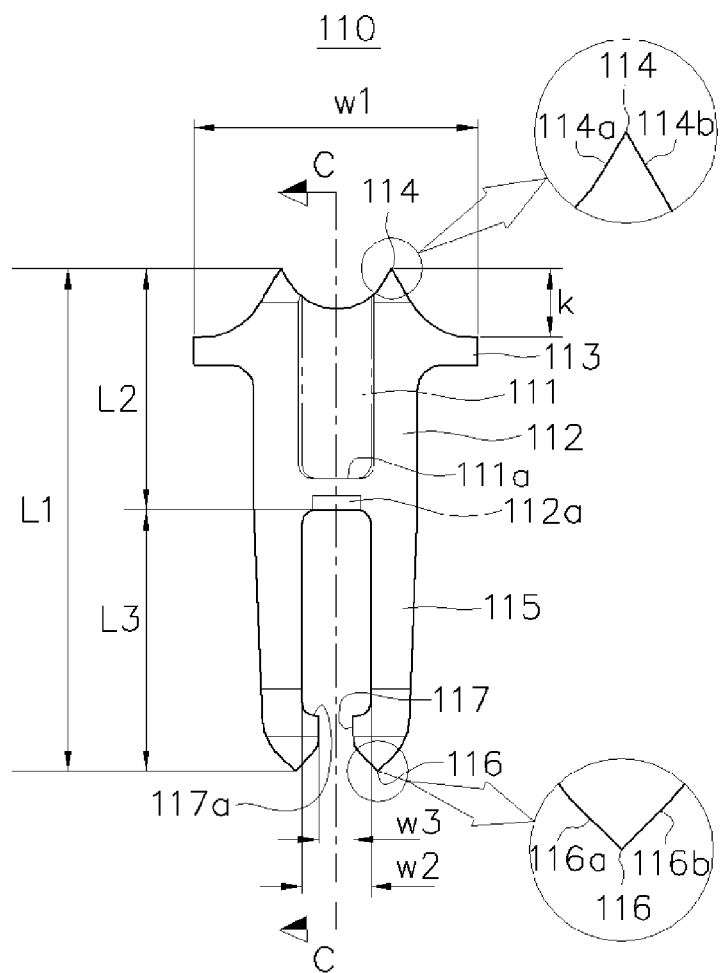
FIGS. 7A and 7B are respectively a plan view and a side view illustrating an upper contact pin according to a first embodiment of the present invention.
Figure 7B:
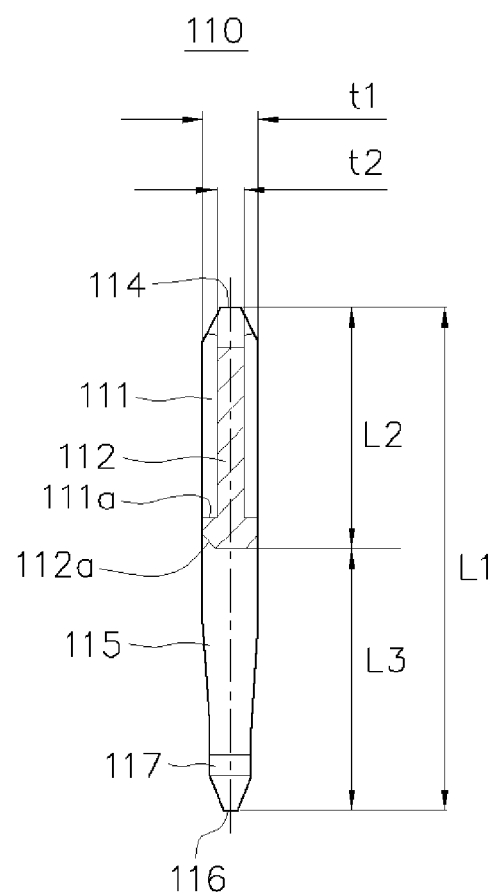

FIGS. 7A and 7B are respectively a plan view and a side view illustrating the upper contact pin according to the first embodiment of the present invention.

Referring to FIGS. 7A and 7B, the upper contact pin 110 according to the present embodiment is provided by the use of a plate-shaped contact pin having a predetermined length L1, a predetermined width w1, and a predetermined thickness t1. In detail, the upper contact pin 110 includes a body portion 112 including a groove 111 that is recessed in each of opposite surfaces thereof in a longitudinal direction thereof, a shoulder protrusion 113 formed to protrude vertically from each of left and right side ends of the body portion 112, a pair of first end contact portions 114 integrally extending from opposite sides of an upper end of the body portion 112 to be symmetrical each other with respect to the respective grooves 111, a pair of elastic portions 115 extending in the longitudinal direction of the body portion 112 to be bilaterally symmetrical to each other, a second end contact portion 116 formed at an end of each of the elastic portions 115, and a guide surface 117 protruding inward from an end portion of each of the elastic portions 115 such that the respective guide surfaces 117 face each other.

The body portion 112 is configured such that the groove 111 recessed with a predetermined width and a predetermined depth along the central axis in the longitudinal direction thereof is provided in each of both the opposite surfaces thereof. Each of the respective grooves 111 is configured such that an upper end thereof is open at the upper end of the body portion 112 while a lower end thereof has a hook locking step 111a having a step height. The entire body portion 112 has the predetermined thickness t1, while a groove section of the body portion 112 where the grooves 111 are formed has a thinner thickness t2 (t2<t1).

The body portion 112 includes a pair of shoulder protrusions 113 protruding to extend from the left and right side ends thereof. These shoulder protrusions 113 support the spring 130. Meanwhile, the maximum width of the upper contact pin 110 is determined by the width w1 between the two shoulder protrusions 113.

The first end contact portions 114 integrally extend from the upper end of the body portion 112 to be bilaterally symmetrical to each other. Preferably, each of the first end contact portions 114 includes an edge line formed by two different contact surfaces that are in contact each other. In the present embodiment, each of the first end contact portions 114 is illustrated that first contact surfaces 114a and 114b comprised of two curved surfaces are in contact with each other to form an upper edge line. Herein, the contact surfaces may be curved surfaces having a predetermined curvature or inclined surfaces having a predetermined angle of inclination. The first end contact portions 114 are portions that come into line contact with a lead of an IC.

The elastic portions 115 are arranged spaced apart from each other by a predetermined width w2 in the longitudinal direction of the body portion 112 to be bilaterally symmetrical each other. Each of the elastic portions 115 has the end portion provided with the guide surface 117 protruding inward such that the respective guide surfaces 117 face each other. An inflection end 117a extending from the end portion of each of the elastic portions 115 to the guide surface 117 acts as a hook to limit upward and downward movement between the two contact pins.

Therefore, a width w3 between the guide surfaces 115 of the respective elastic portions 115 is shorter than the width w2 between the two elastic portions 115 (w3<w2). Preferably, the width w3 between the two guide surfaces 115 is equal to or greater than a thickness t2 of the groove section of the body portion 112 where the grooves 111 are formed (t2≤w3). In addition, the width w2 between the two elastic portions 115 is equal to or greater than the thickness t1 of the body portion 112 (t1≤w2).

When the upper contact pin and the lower contact pin are assembled, the guide surfaces 117 of the upper contact pin are inserted into grooves of the lower contact pin while guide surfaces of the lower contact pin are inserted into the grooves 111 of the upper contact pin, and each guide surface comes into contact with a bottom surface of each groove to serve to allow the upper and lower contact pins to be electrically connected to each other.

A lower end edge of the body portion 112 located adjacent between the two elastic portions 115 includes a chamfered inclined surface 112a having an inclination. The chamfered inclined surface 112a serves to facilitate assembly between the elastic portions 115 when the two contact pins are assembled.

The second end contact portion 116 extends vertically from the end of each of the elastic portions 115. Preferably, each of the respective second end contact portions 116 includes an edge line formed by two different contact surfaces that are in contact with each other. In the present embodiment, each of the second end contact portions 116 is illustrated that second contact surfaces 116a and 116b comprised of two curved surfaces are in contact with each other to form an upper edge line. Herein, the contact surfaces may be curved surfaces having a predetermined curvature or inclined surfaces having a predetermined angle of inclination. The second end contact portions 114 are portions that come into line contact with a lead of an IC.

Preferably, a length L3 of the elastic portions 115 including the second end contact portions 116 is longer than a length L2 from the first end contact portions 114 to the lower end of the body portion 112 (L2<L3).

Figure 8A:
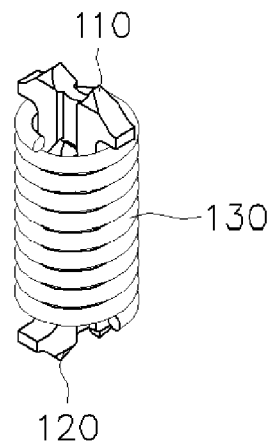
FIGS. 8A, 8B, and 8C are views illustrating an extended state of the spring contact according to the first embodiment of the present invention.
Figure 8B:
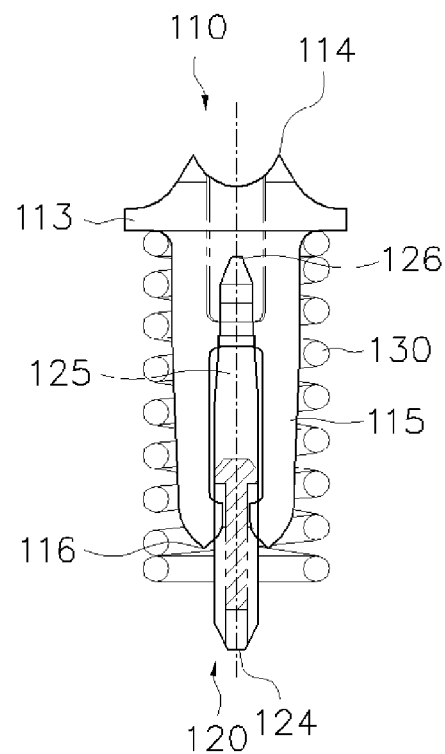
Figure 8C:
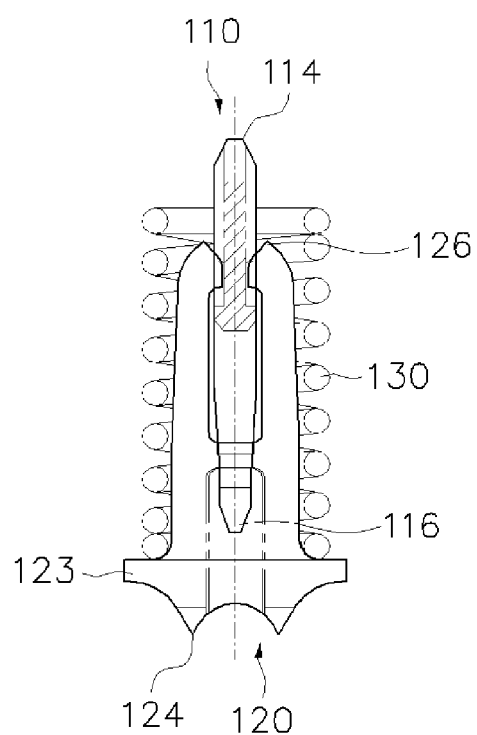

FIGS. 8A, 8B, and 8C are views illustrating an extended state of the spring contact according to the first embodiment of the present invention, in which FIG. 8A is a perspective view, and FIGS. 8B and 8C are sectional views in directions perpendicular to each other.

Referring to FIGS. 8A, 8B, and 8C, the upper contact pin 110 and the lower contact pin 120 are assembled in the longitudinal directions thereof such that the respective elastic portions 115 and 125 cross each other, and the spring 130 is supported by the shoulder protrusions 113 and 123 of the upper and lower contact pins 110 and 120 to maintain the upper and lower contact pins 110 and 120 in an extended state.

In such an extended state of the spring contact 100, the first end contact portions 114 of the upper contact pin 110 are exposed outside an upper end of the spring 130, while second end contact portions 126 of the lower contact pin 210 are located inside the spring 130. On the contrary, first end contact portions 124 of the lower contact pin 120 are exposed outside a lower end of the spring 130, while the second end contact portions 116 of the upper contact pin 110 are located inside the spring 130.

Figure 9A:
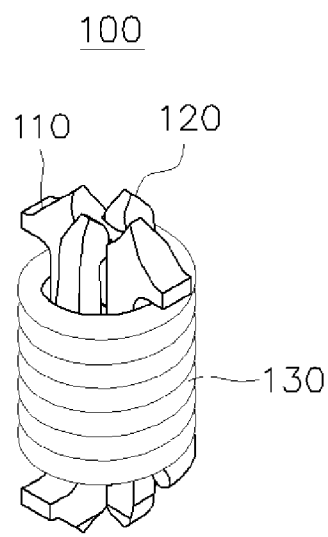
FIGS. 9A, 9B, and 9C are views illustrating a compressed state of the spring contact according to the first embodiment of the present invention.
Figure 9B:
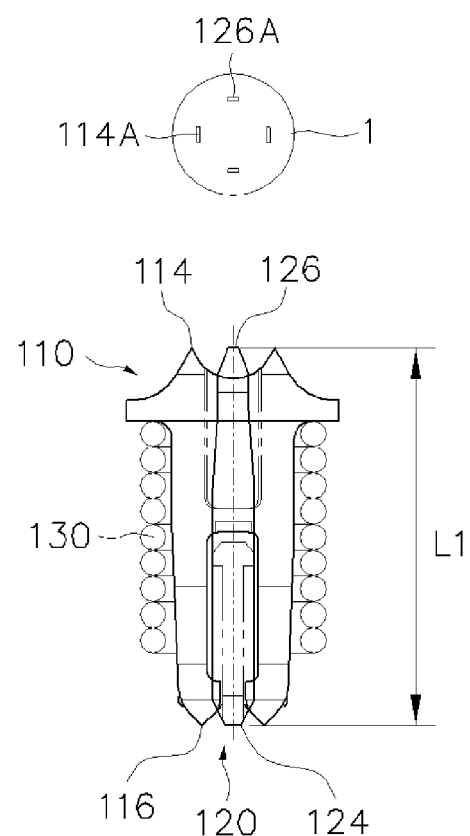
Figure 9C:
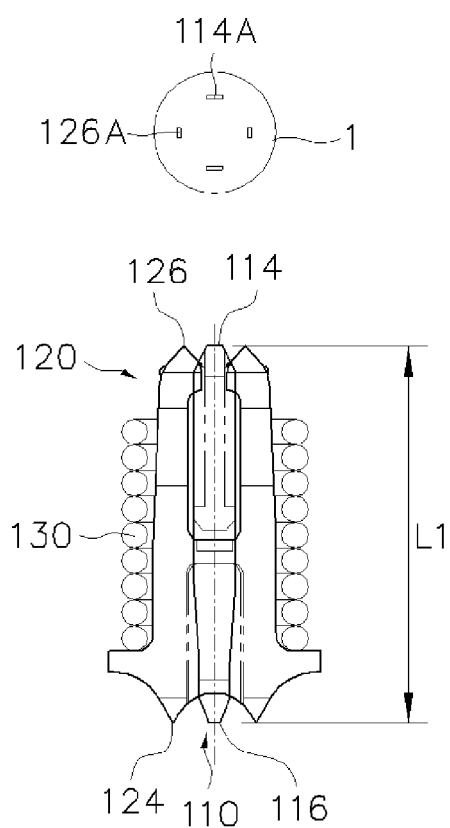

FIGS. 9A, 9B, and 9C are views illustrating a compressed state of the spring contact according to the first embodiment of the present invention, in which FIG. 9A is a perspective view, and FIGS. 9B and 9C are sectional views in directions perpendicular to each other. In FIGS. 9B and 9C, an upper view located above the spring contact illustrates a lead ball of an IC in plan view, which illustrates a contact portion between end contact portions and the lead ball.

Referring to FIGS. 9A, 9B, and 9C, a total length L1 of the spring contact 100 in a compressed state is the same as the length L1 of a single contact pin (see FIG. 7). Herein, the first end contact portions 114 of the upper contact pin 110 and the second end contact portions 126 of the lower contact pin 120, which define an upper end portion of the spring contact 100, come into contact with a lead ball 1 of an IC simultaneously at four positions 114A and 126A in directions perpendicular to each other.

Similarly, also in the case of a lower end portion of the spring contact 100, the second end contact portions 116 of the upper contact pin 110 and the first end contact portions 124 of the lower contact pin 120 come into contact with a lead (not illustrated) of a PCB simultaneously.

As described above, the spring contact 100 according to the present invention is characterized in that electrical contact of the end contact portions with the lead ball 1 is established at four plural positions in a compressed state of the spring contact. Advantageously, a reduced design of the length L1 of the spring contact is also possible, thereby minimizing electrical resistance.

Figure 10A:
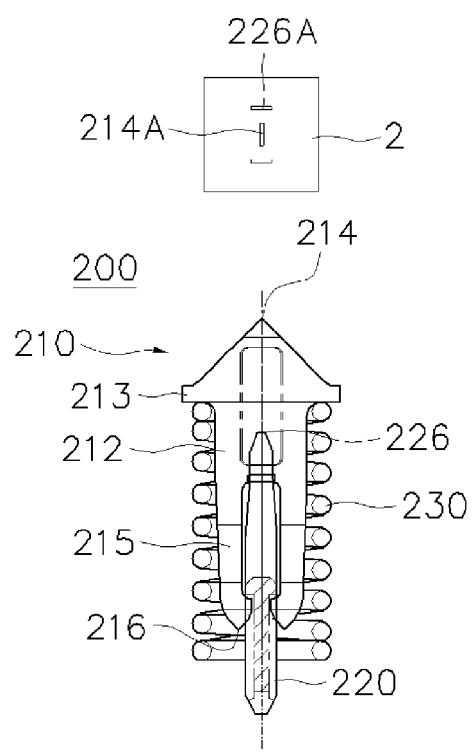
FIGS. 10A, 10B, and 10C are views illustrating a spring contact according to a modification of the first embodiment of the present invention.
Figure 10B:
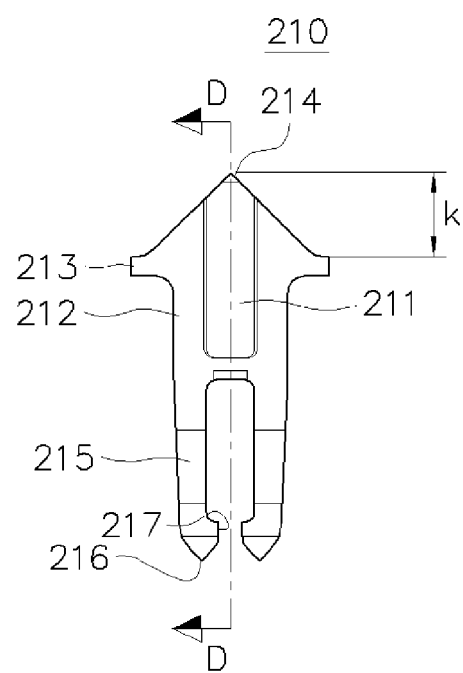
Figure 10C:
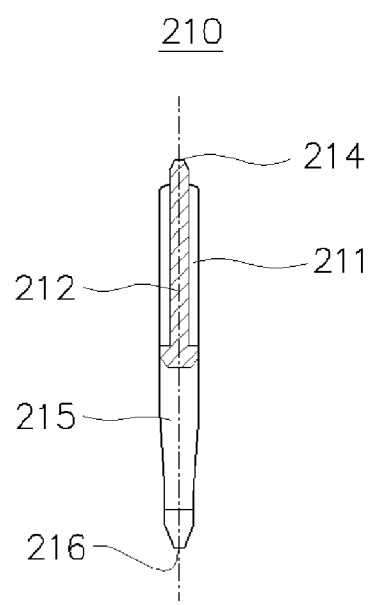

FIGS. 10A, 10B, and 10C are views illustrating a spring contact according to a modification of the first embodiment of the present invention, in which FIG. 10A is a sectional view, FIG. 10B is a plan view illustrating an upper contact pin, and FIG. 10C is sectional view taken along line D-D. In FIG. 10A, an upper view located above the spring contact illustrates a lead 2 of a land-type IC in plan view, which illustrates a contact portion between end contact portions and the lead.

Referring to FIGS. 10A, 10B, and 10C, a spring contact 200 of the present embodiment remain the same as that of the previous embodiment in that the spring contact 200 includes an upper contact pin 210, a lower contact pin 220 assembled to the upper contact pin 210 such that the upper and lower contact pins 210 and 220 cross each other, and a spring 230 elastically supporting the upper and lower contact pins 210 and 220, and in that the upper and lower contact pins 210 and 220 are commonly provided by the use of a single contact pin.

The upper contact pin 210 remains the same as that of the previous embodiment in that the upper contact pin 210 includes a body portion 212 including a groove 111 that is recessed in each of opposite surfaces thereof, a shoulder protrusion 213 formed to protrude vertically from each of left and right side ends of the body portion 212, a pair of elastic portions 215 extending in a longitudinal direction of the body portion 212 to be bilaterally symmetrical to each other, a second end contact portion 216 formed at an end of each of the elastic portions 215, and a guide surface 217. In particular, the upper contact pin 210 in the present embodiment includes one first end contact portion 214 extending on the central axis.

The first end contact portion 214 includes an edge line formed by two different inclined contact surfaces that are in contact with each other. Herein, the contact surfaces may be provided by the use of curved surfaces. Meanwhile, a height k of the first end contact portion 214 from the respective shoulder protrusions 213 may be determined in consideration of the height of the lead of the IC.

A total length L1 of the spring contact 200 of the present embodiment configured as described above in a compressed state is the same as the length of a single contact pin. Herein, the first end contact portion 214 of the upper contact pin 210 and second end contact portions 226 of the lower contact pin 220, which define an upper end portion of the spring contact 200, come into contact with the lead 2 of the IC simultaneously at three positions 214A and 226A.

As such, the first end contact portion 214 of the upper contact pin 210 may include a single edge line or two or more corner edge lines depending on the lead of the IC.

Second Embodiment

Figure 11A:
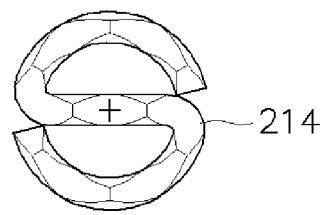
FIGS. 11A to 14B are views illustrating a spring contact according to a second embodiment of the present invention.
Figure 11B:
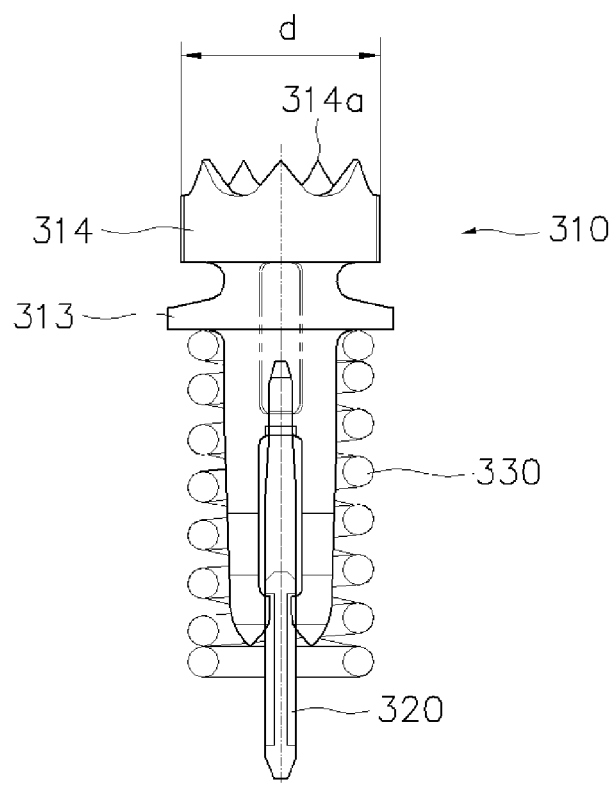
Figure 12:
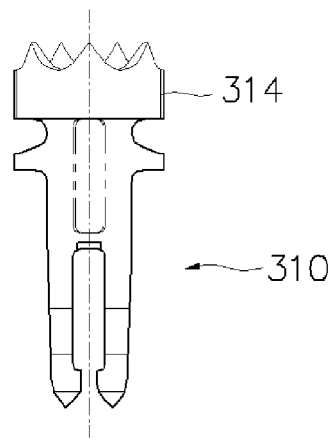
Figure 12:
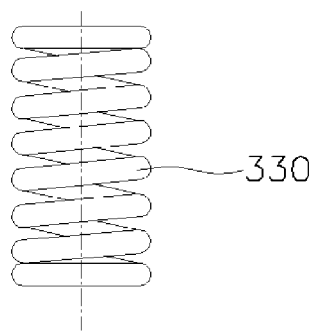
Figure 12:
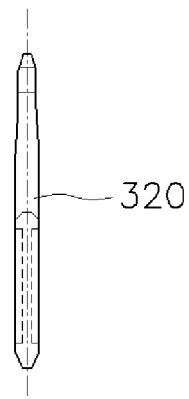

FIGS. 11A and 11Bb are respectively a plan view and a front view illustrating a spring contact according to a second embodiment of the present invention, and FIG. 12 is an exploded view illustrating the spring contact according to the second embodiment of the present invention.

Referring to FIGS. 11A, 11B, and 11C and FIG. 12, a spring contact 300 of the present embodiment includes an upper contact pin 310, a lower contact pin 320 assembled to the upper contact pin 310 such that the upper and lower contact pins 310 and 320 cross each other, and a spring 330 elastically supporting the upper and lower contact pins 310 and 320.

Preferably, the upper contact pin 310 includes a cylindrical head portion 314 provided at an upper portion thereof and having a predetermined outer diameter d. The head portion 314 is formed integrally with a body portion 312 constituting the upper contact pin 310 and may be provided by rolling a plate manufactured by stamping into a substantially "S" shape. The outer diameter d of the head portion 314 is appropriately determined in consideration of the size of a lead (ball) of an IC. Preferably, the width between two shoulder protrusions 313 protruding horizontally from left and right sides of the body portion 312 to support the spring 330 is larger than the outer diameter d of the head portion 314.

In the present embodiment, the lower contact pin 320 is substantially the same as the plate-shaped contact pin of the first embodiment, and thus a duplicate description is omitted.

The spring 330 is provided by the use of a coiled compression spring that resists the compressive force. The spring 330 is provided between the upper contact pin 310 and the lower contact pin 320 to provide a restoring force for returning the upper contact pin 310 and the lower contact pin 320 to original positions thereof when the upper contact pin 310 and the lower contact pin 320 are compressed in longitudinal directions thereof.

Figure 13A:
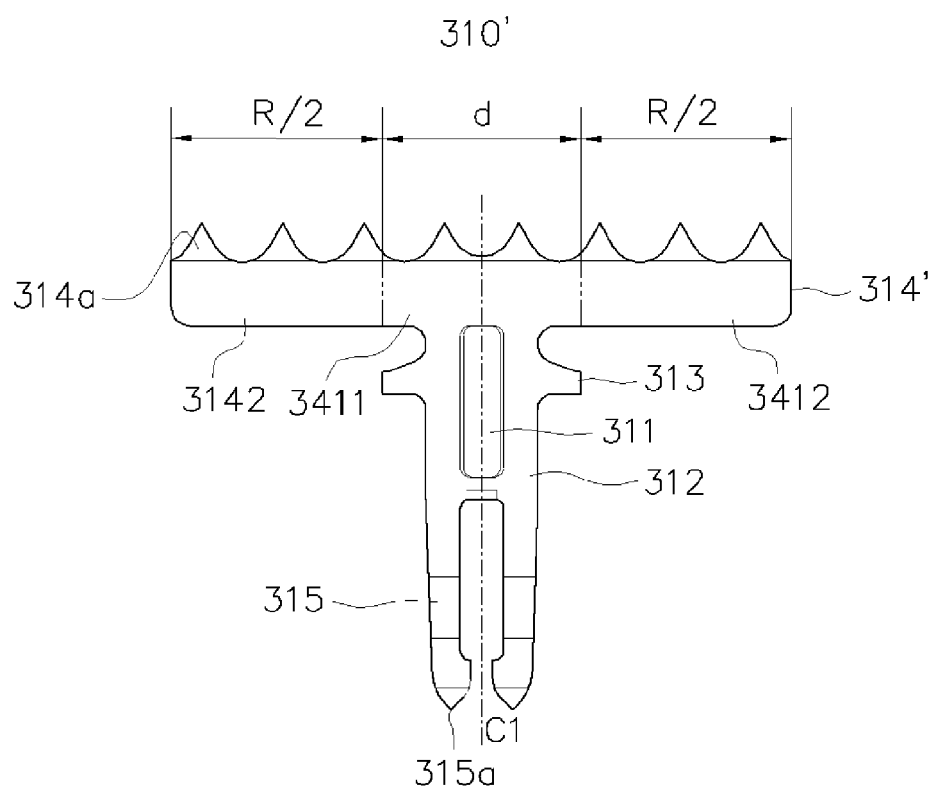
Figure 13B:
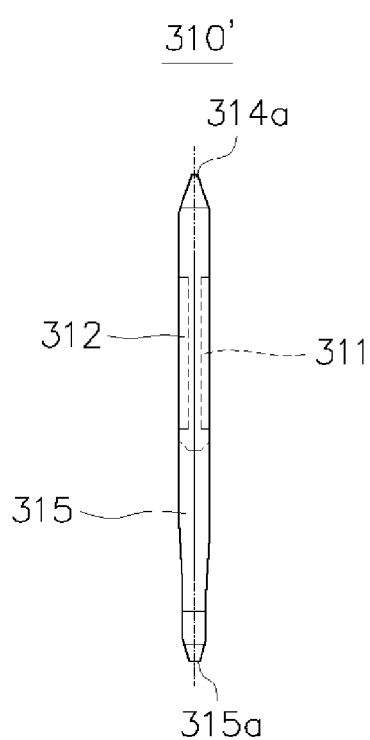

FIGS. 13A and 13B are respectively a front view and a side view illustrating an unfolded state of the upper contact pin of the spring contact according to the second embodiment of the present invention.

Referring to FIG. 13, the plate-shaped upper contact pin 310' includes a strip 314' integrally and horizontally provided at an upper portion of the body portion 312, and first end contact portions 314a are provided at an upper end of the strip 314'.

The strip 314' has the same left and right lengths with respect to a center C1 of the body portion 312 and is rolled to have a cylindrical shape.

In detail, the strip 314' forms the cylindrical head portion 314 including a first strip section 3411 located on the same plane as the body portion 312 and provided to have the same left and right distances from the center C1 of the body portion 312, and a second strip section 3314 rolled clockwise (or counterclockwise) at each of opposite ends of the first strip section 3411 to have a semi-circular arc shape. The head portion 314 having such a structure has an approximately "S" shape in a plan (see FIG. 11A). Meanwhile, the head portion 314 may have a bilaterally symmetrical shape of "S" in a plane depending on the rolling direction of the respective second strip sections 3314.

The first strip section 3411 is located in a radial direction of the cylindrical head portion 314, and thus a length d thereof corresponds approximately to a cylindrical diameter. A sum of lengths R/2 of the respective second strip sections 3314 provided at the opposite ends of the first strip section 3411 corresponds to a cylindrical circumference R of the head portion 314. Therefore, a sum R of the length d of the first strip section 3411 and the lengths of the two second strip sections 3412 fulfills a relationship of R (length of the cylindrical circumference)=d (diameter of the circle) ⌊∧π (radius).

The body portion 312 includes a groove 311 formed in each of opposite surfaces thereof in a longitudinal direction thereof, a shoulder protrusion 313 formed at each of left and right side ends of the body portion to support the spring 330, a pair of elastic portions 315 extending downward to be bilaterally symmetrical to each other in the longitudinal direction of the body portion 312, and a second end protrusion 315a formed at an end of each of the elastic portions 315. This configuration is substantially the same as that of the previous first embodiment.

Figure 14A:
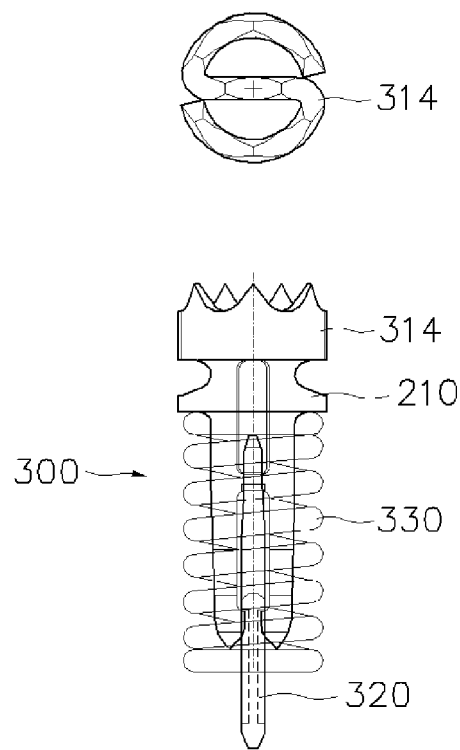
Figure 14B:
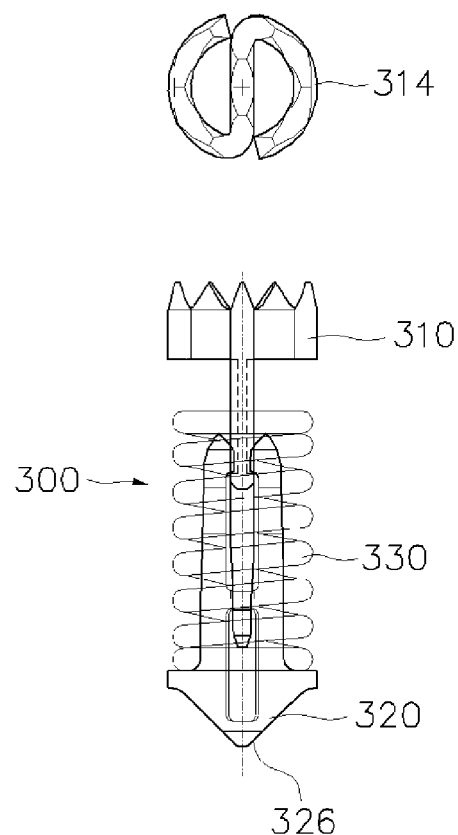

FIGS. 14A and 14B are front views illustrating the spring contact according to the second embodiment of the present invention. FIGS. 14A and 14B are views in directions perpendicular to each other, which illustrate the spring contact in plan view.

In FIGS. 14A and 14B, the lower contact pin 320 includes one end contact portion 326 provided at a lower end thereof. However, the shape of the end contact portion of the lower contact pin 320 is not limited thereto and may be variously modified depending on the type or size of leads.

Figure 15A:
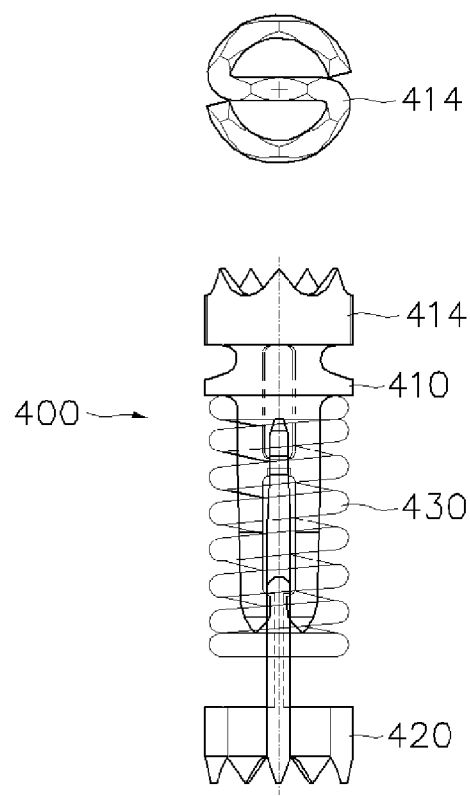
FIGS. 15A and 15B are views illustrating a modification to the second embodiment of the present invention.
Figure 15B:
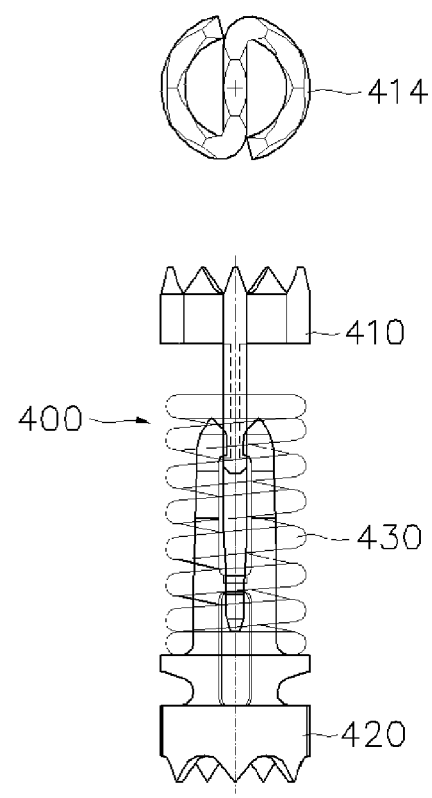

FIGS. 15A and 15B are views illustrating a spring contact according to a modification of the second embodiment of the present invention. A spring contact 400 of the present embodiment includes an upper contact pin 410 and a lower contact pin 420 which are provided by the use of contact pins of the same shape.

As described above, it will be appreciated that in each embodiment, upper and lower contact pins having the same shape may be assembled with each other, or depending on the type of leads, upper and lower contact pins may be provided by the use of a combination of two different contact pins having end contact portions of the structure suitable for the same.

Third Embodiment

Figure 16:
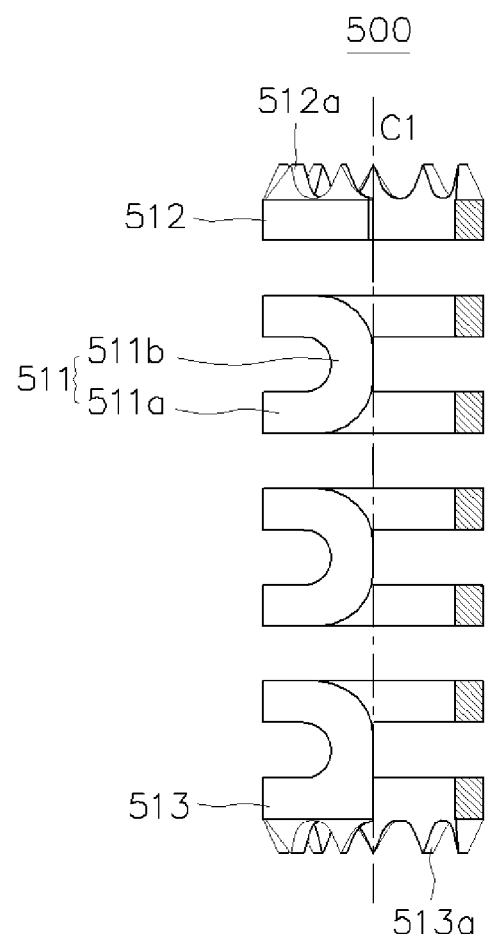
FIGS. 16 to 18 are views illustrating a spring contact according to a third embodiment of the present invention.
Figure 17:
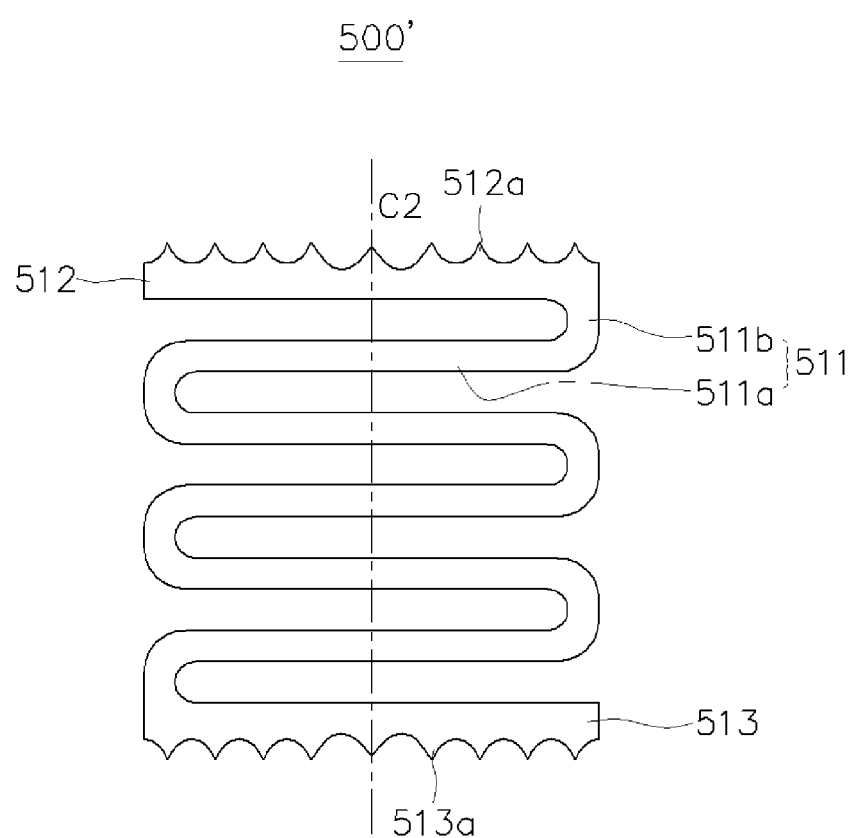
Figure 18:
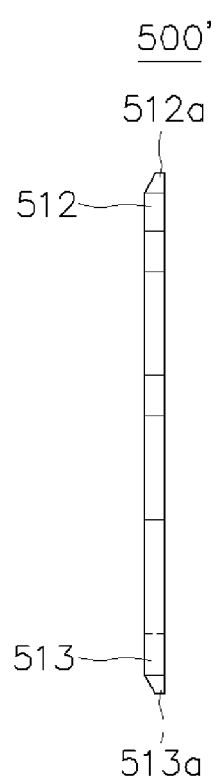

FIGS. 16 to 18 are views illustrating a spring contact according to a third embodiment of the present invention. FIG. 16 is a front view illustrating the spring contact in a partially cutaway state, FIG. 17 is a front view illustrating an unfolded state of the spring contact before rolling, and FIG. 18 is a side view illustrating the unfolded state.

As illustrated in FIG. 16, a spring contact 500 of the present embodiment is characterized by being integrally formed in such a manner that a strip pattern formed by punching out a metal plate is rolled into a cylindrical shape.

In detail, referring to FIGS. 17 and 18, a strip pattern 500' of the spring contact includes an elastic portion 511 in which a unit strip 511a and 511b comprised of a horizontal strip 511a and a vertical strip 511b are connected to each other in a zigzag pattern, an upper head portion 512 that extends from an uppermost end of the elastic portion 511 and includes upper end portions 512a protruding upward, a lower head portion 513 that extends from a lowermost end of the elastic portion 511 and includes lower end portions 513a protruding downward.

The spring contact may be manufactured by punching a plate mainly made of beryllium copper (BeCu), copper alloy, or stainless steel (SUS) in a predetermined pattern and bending the plate in a cylindrical shape to obtain a contact. Palladium (Pd), palladium (PdNi), palladium nickel (PdNi), or palladium cobalt (PdCo) may be plated on the surface of the contact.

The elastic portion 511 includes the unit strip 511a and 511b, the unit strip being comprised of the horizontal strip 511a, and the vertical strip 511b extending vertically from one end of the horizontal strip 511a and having a shorter length than the horizontal strip 511a. A plurality of unit strips 511a and 511b are connected to each other in a zigzag pattern.

The upper head portion 512 and the lower head portion 513 respectively include the upper end portions 512a and the lower end portions 513b each of which are comprised of a plurality of teeth formed along the edge, and the upper end portions 512a and the lower end portions 513b come into contact with a lead of an IC and a lead of a PCB.

In the present embodiment, the upper head portion 512 and the lower head portion 513 are illustrated as the same as the horizontal strip 511a of the elastic portion 511. However, the present invention is not limited thereto. For example, the width and length may be different.

The plate-shaped strip pattern 510' undergoes bending in a cylindrical shape. The strip pattern 510' is bent in a cylindrical shape with the center of the horizontal strip 511a as a vertical axis C2.

Meanwhile, the spring contact 500 of the present embodiment may be provided by the use of various strip patterns. For example, there may be various modifications such as a strip pattern in which a plurality of closed loops are connected to each other in a longitudinal direction in a partial section of the elastic portion, a spiral strip pattern, or the like.

FIGS. 19A and 19B and FIGS. 20A and 20B are views illustrating modifications of the third embodiment of the present invention.

Figure 19A:
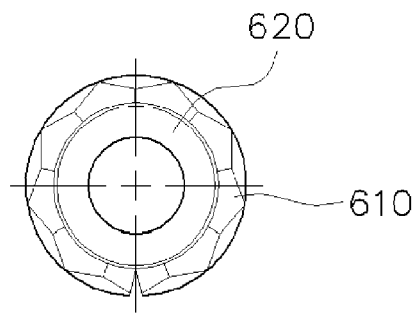
FIGS. 19A and 19B and FIGS. 20A and 20B are views illustrating modifications of the third embodiment of the present invention.
Figure 19B:
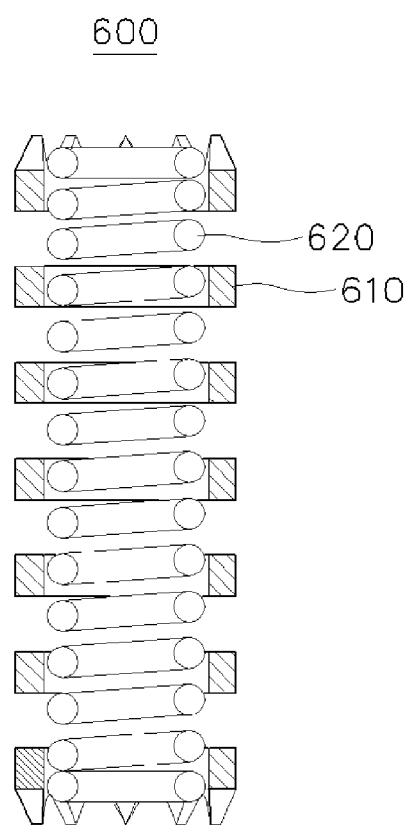

Referring to FIGS. 19A and 19B, a spring contact 600 according to a modification includes a contact unit 610 integrally formed by rolling a strip pattern formed by punching a metal plate into a cylindrical shape, and a coil inserted into the contact unit 610.

Preferably, the outer diameter of the coil spring 620 is smaller than the inner diameter of the contact unit 610 such that the contact unit 610 and the coil spring 620 have a suitable clearance so as not to interfere with each other during operation.

Figure 20A:
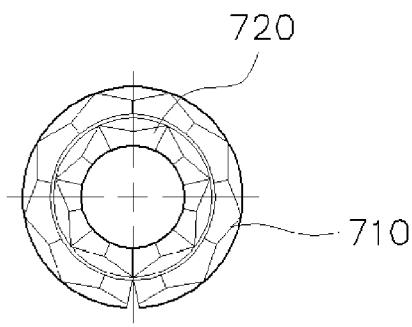
Figure 20B:
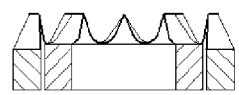
Figure 20B:
Figure 20B:
Figure 20B:
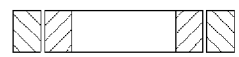
Figure 20B:
Figure 20B:
Figure 20B:
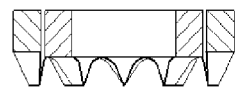

Referring to FIGS. 20A and 20B, a spring contact 700 according to another modification includes a first contact unit 710 integrally formed by rolling a strip pattern formed by punching a metal plate into a cylindrical shape, and a second contact unit 720 inserted into the first contact unit 710. The second contact unit 720 is manufactured in the same manner by rolling a strip pattern formed by punching a metal plate into a cylindrical shape.

The first contact unit 710 and the second contact unit 720 may be provided by the use of the same strip pattern. Alternatively, the first contact unit 710 and the second contact unit 720 may have different strip patterns.

The outer diameter of the second contact unit 720 is smaller than the inner diameter of the first contact unit 710 such that the first contact unit 710 and the second contact unit 720 have a suitable clearance so as not to interfere with each other during operation.

Hereinafter, a test socket including spring contacts will be described in detail.

First Embodiment

Figure 21:
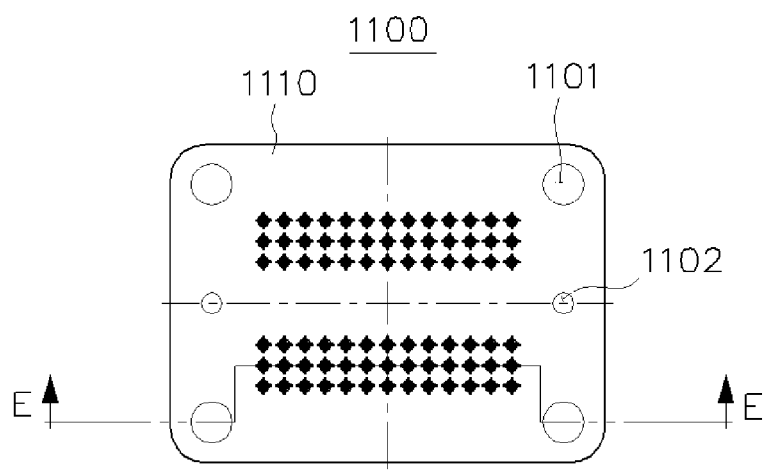
FIG. 21 is a plan view illustrating a test socket according to a first embodiment of the present invention.
Figure 22:
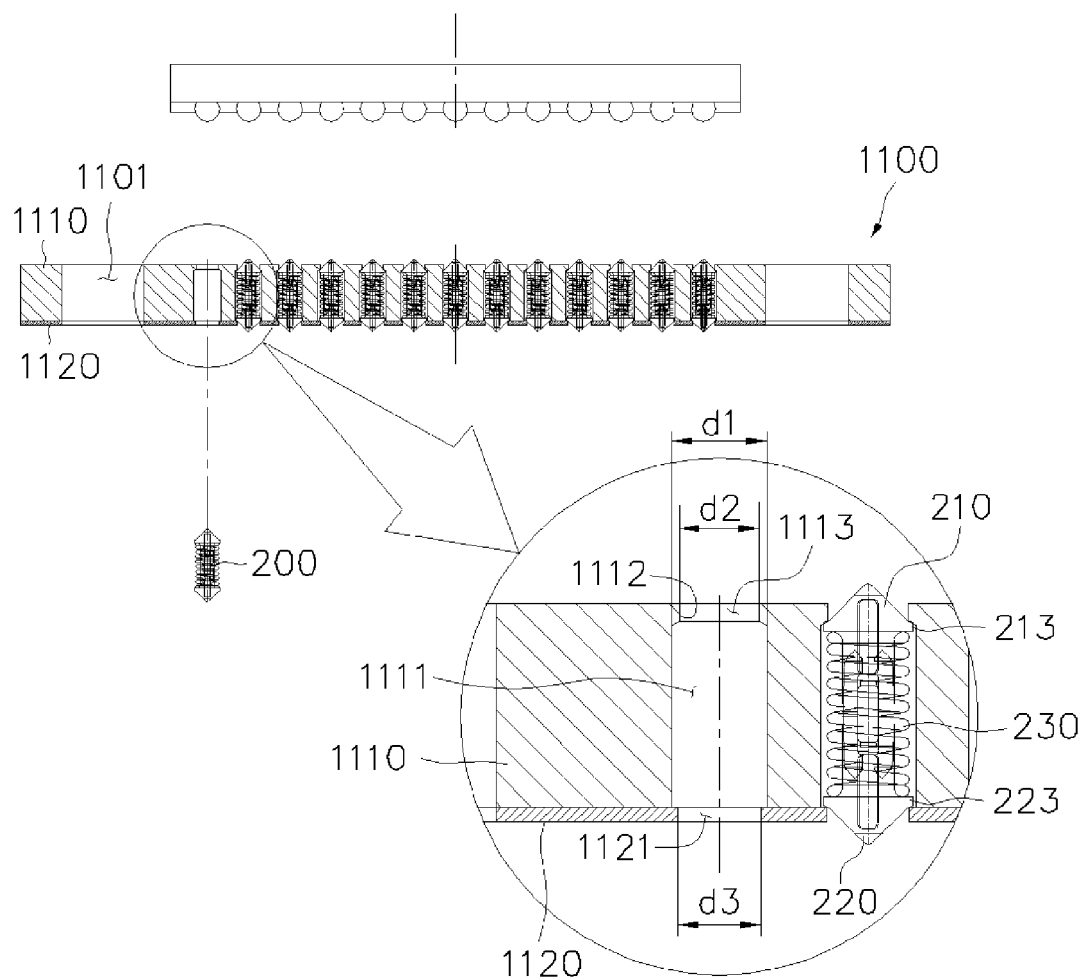
FIG. 22 is a cross-sectional view taken along line E-E in FIG. 21.

FIG. 21 is a plan view illustrating a test socket according to a first embodiment of the present invention, and FIG. 22 is a sectional view taken along line E-E of FIG. 21. For reference, in FIG. 21, an upper contact pin 210 and a lower contact pin 220 constituting a spring contact 200 are assembled to vertically cross each other. However, the upper contact pin 210 and the lower contact pin 220 are illustrated as assembled on the same plane for ease of understanding.

Referring to FIGS. 21 and 22, a test socket 1100 of the present embodiment includes: a plurality of spring contacts 220 each of which includes the upper contact pin 210, the lower contact pin 220 assembled to the upper contact pin 210 such that the upper and lower contact pins 210 and 220 cross each other to mutually linearly operate, and a coil spring 230 elastically supporting the upper contact pin 210 and the lower contact pin 220; a main plate 1110 having a plurality of accommodating holes 1111 in which the respective spring contacts 200 are accommodated; and a film plate 1120 provided on a lower portion of the main plate 1110.

Preferably, the main plate 1110 has first openings 1113 each of which has a diameter d2 smaller than a diameter d1 of each of the accommodating holes 1111 formed to support each of the respective upper contact pins 210 by a stepped portion 1112 protruding horizontally from an upper opening end of each of the accommodating holes 1111. In detail, the diameter d2 of each of the first openings 1113 is smaller than the width of shoulder protrusions 213 formed at each of the upper contact pins 210.

The film plate 1120 is attached to a lower portion of the main plate 1110 and has second openings 1121 each of which is formed at a position corresponding to each of the accommodating holes 1111 to have a diameter d3 smaller than the diameter d1 of the accommodating hole 1111. In detail, the diameter d3 of each of the second openings 1121 is smaller than the width of shoulder protrusions 223 of each of the respective lower contact pins 220.

The test socket 1100 may include at least one mounting hole 1101 for mounting the socket, and a guide hole 1102 for guiding the socket to be positioned in place. In the present embodiment, the mounting hole 1101 and the guide hole 1102 are illustrated as formed through the main plate 1110 and the film plate 1120.

In the test socket 1100, the upward movement of the upper contact pins 210 1111 are limited in the accommodating holes by the respective stepped portions 1112 and the downward movement of the lower contact pins 220 are limited by the film plate 1120, whereby leads of an IC and leads of a PCB are elastically connected to each other by the respective coil springs 230.

An assembly process of the spring contacts 200 and the test socket 1100 may be performed in such a manner that the spring contacts 200 are first inserted into the respective lower openings of the accommodating holes 1111 and then the film plate 1120 is attached to a lower surface of the main plate 1110. On the other hand, the film plate 1120 may be attached to the main plate 1120 first, and then the spring contacts 200 may be forcibly inserted into the respective second openings 1121 of the film plate 1120.

Second Embodiment

Figure 23:
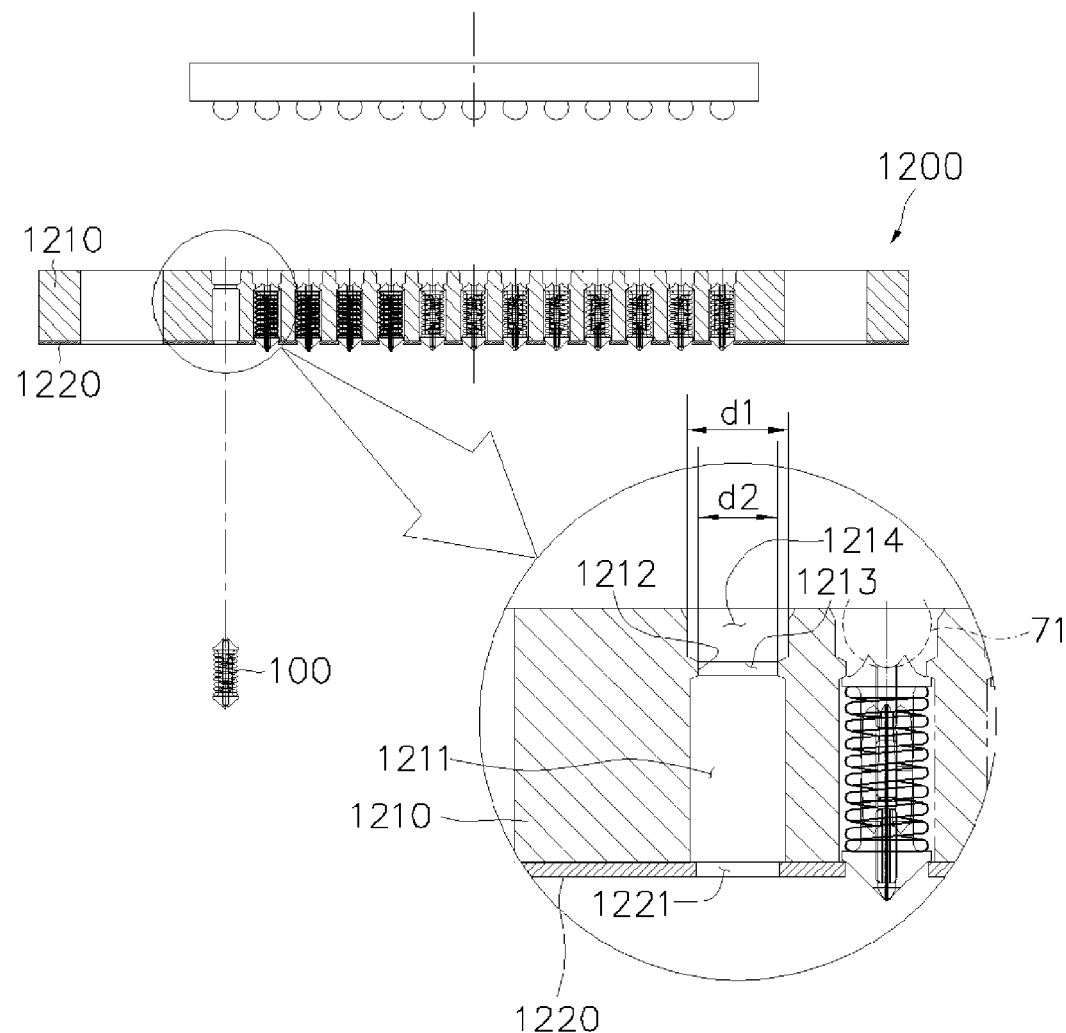
FIG. 23 is a sectional view illustrating a test socket according to a second embodiment of the present invention.

FIG. 23 is a sectional view illustrating a test socket according to a second embodiment of the present invention.

Referring to FIG. 23, a test socket 1200 according to the present embodiment includes spring contacts 100 each of which includes two contact pins 110 and 120 elastically supported by a coil spring 130 and assembled to cross each other, a main plate 1210 in which the spring contacts 100 are accommodated, and a film plate 1220. This configuration remains the same as that of the first embodiment.

In the present embodiment, the main plate 1210 has pocket holes 1214 formed in an upper surface thereof, each of the pocket holes 1214 being wider than a diameter d2 of each of first openings 1213 to accommodate each lead ball 71 of an IC.

The height and diameter of the pocket holes 1214 is determined in consideration of the size of lead balls 71 of the IC. Each of the pocket holes 1214 is configured such that an upper opening end thereof has a curved surface. This configuration allows that when the IC is loaded into the test socket 1200, the lead balls 71 can be guided to the respective pocket holes 1214 along the curved surfaces and thus the lead balls 71 and the spring contacts 100 can come into contact with each other at correct positions.

In the present embodiment, each of the spring contacts 100 is illustrated that an end contact portion of the upper contact pin 110 is configured as a pair, and the shape of the end contact portion of each contact pin may vary depending on the leads of the IC.

Third Embodiment

Figure 24:
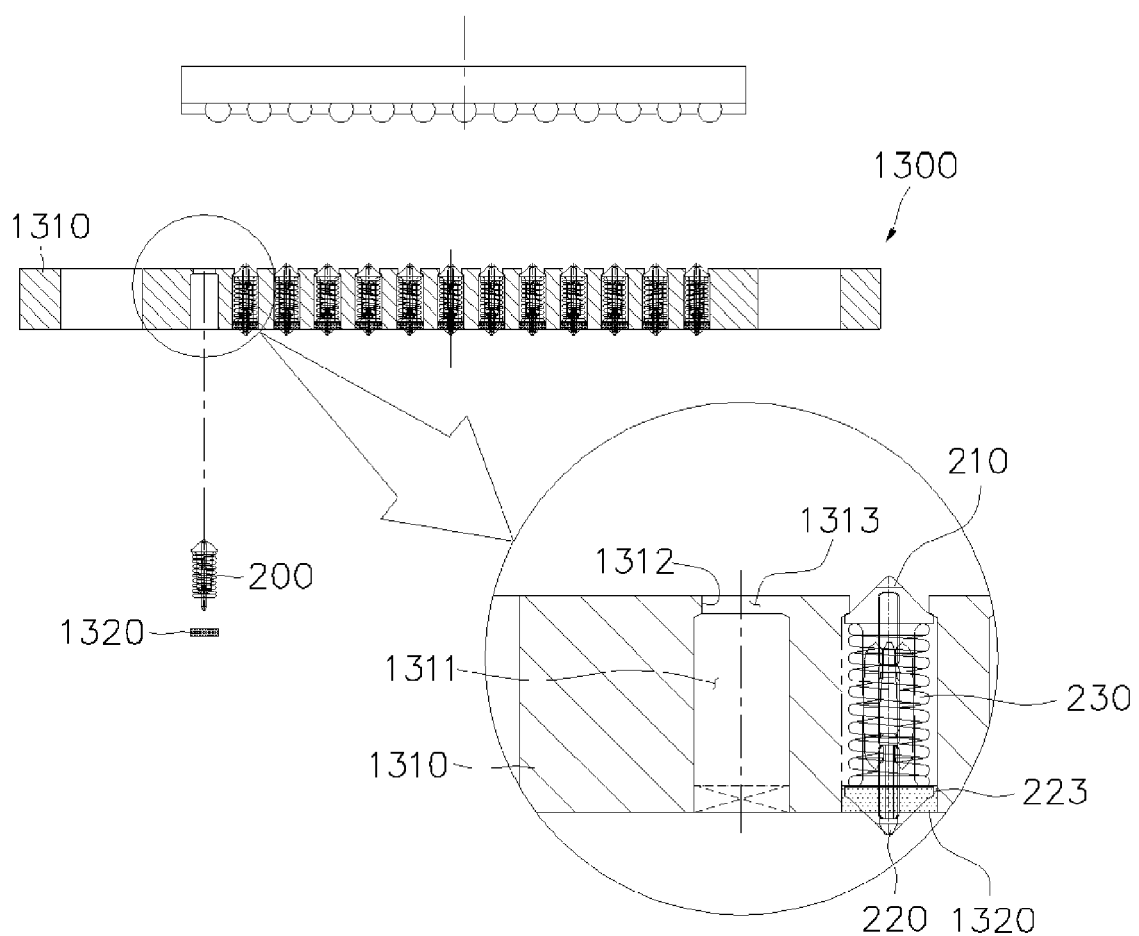
FIG. 24 is a sectional view illustrating a test socket according to a third embodiment of the present invention.

FIG. 24 is a sectional view illustrating a test socket according to a third embodiment of the present invention.

As illustrated in FIG. 24, a test socket 1300 of the present embodiment includes spring contacts 200 each of which includes two contact pins 210 and 220 elastically supported by a coil spring 230 and assembled to cross each other, a main plate 1310 having a plurality of accommodating holes 1311 in which the respective spring contacts 200 are accommodated, and a silicone caulking part 1320 inserted into a lower opening end of each of the accommodating holes 1311 to fix each lower contact pin 220 to the main plate 1310.

Similarly to the previous first embodiment, the main plate 1310 includes first openings 1313 each of which has a diameter d2 smaller than a diameter d1 of each of the accommodating holes 1311 support formed to each of the respective upper contact pins 210 by a stepped portion 1312 protruding horizontally from an upper opening end of each of the accommodating holes 1311.

The respective silicone caulking parts 1320 are inserted into the accommodating holes 1311 to predetermined depths after the spring contacts 200 are inserted into the accommodating holes 1311 through lower openings of the accommodating holes 1311 to be temporarily assembled to the main plate 1310, whereby the respective lower contact pins 220 are fixed to the main plate 1310.

The silicone caulking parts 1320 may be provided by the use of an elastic silicone rubber. The silicone caulking parts 1320 fix lower ends of the lower contact pins 220 while being compressed within the elastic range of the material of the silicone caulking parts 1320 themselves.

Preferably, insertion depths of the silicone caulking parts 1320 are reached appropriately to depths of shoulder protrusions 223 of the lower contact pins 220. This is because elastic deformation of the respective coil springs 230 may be interfered with when the insertion depths are greater than the depths of shoulder protrusions 223.

Meanwhile, in the present embodiment, the main plate 1310 may have pocket holes (refer to the second embodiment) formed in an upper portion thereof to accommodate lead balls of an IC.

Fourth Embodiment

Figure 25:
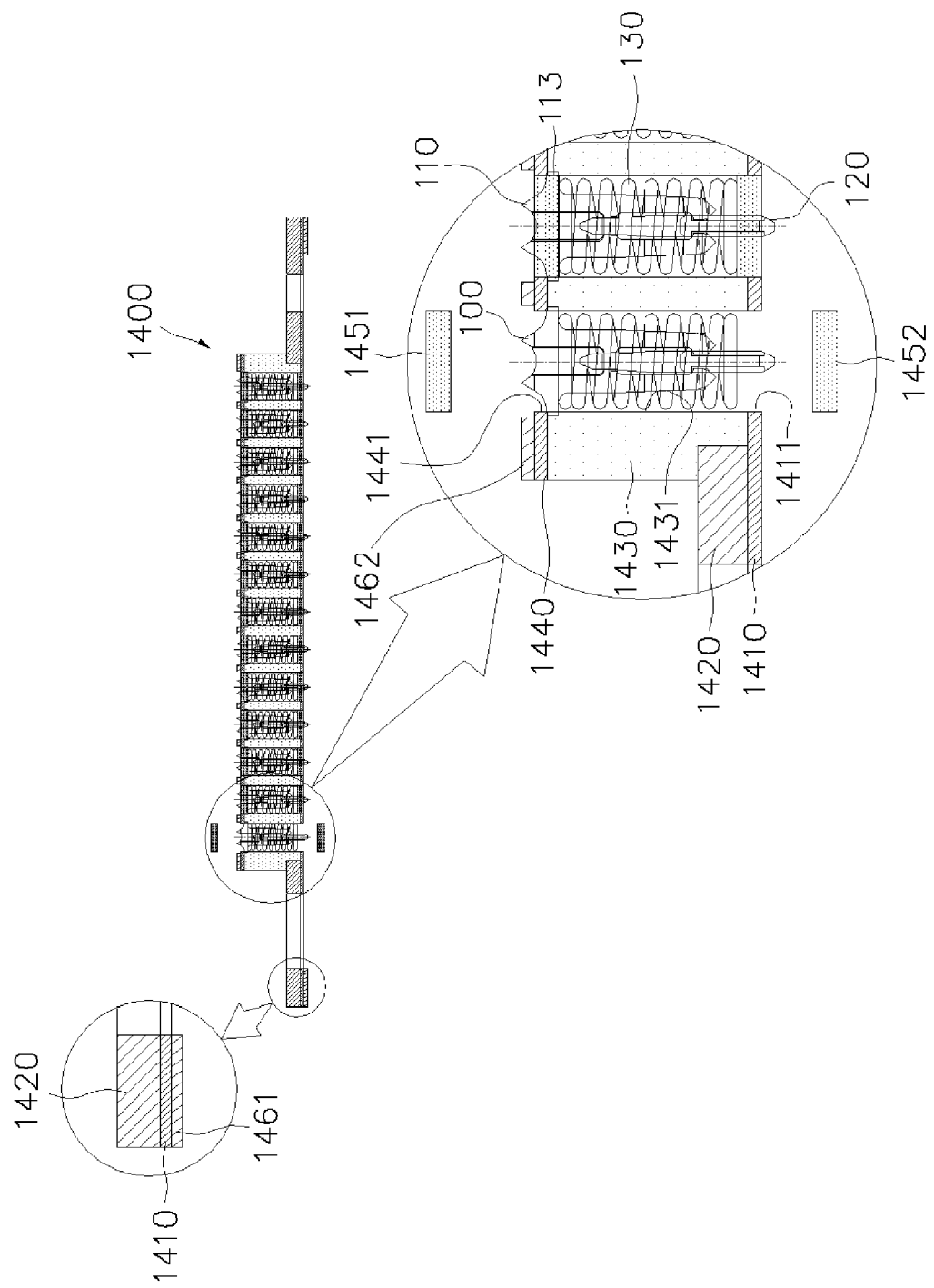
FIGS. 25 and 26 are sectional views illustrating a test socket according to a fourth embodiment of the present invention.

FIG. 25 is a sectional view illustrating a test socket according to a fourth embodiment of the present invention.

Referring to FIG. 25, a test socket 1400 of the present embodiment includes: a plurality of spring contacts 200 each of which includes two contact pins 210 and 220 elastically supported by a coil spring 230 and assembled to cross each other; a lower film plate 1410 having a plurality of first through-holes 1411 through which the respective spring contacts 100 are positioned; a mounting part 1420 provided on an upper side of the lower film plate 1410; an insulating body 1430 provided on an upper side of the mounting part 1420 and having second through-holes 1431 formed corresponding to the first through-holes 1411 to accommodate the spring contacts 100; an upper film plate 1440 provided on an upper surface of the insulating body 1430 and having third through-holes 1441 formed corresponding to the second through-holes 1431; and a first silicone caulking part 1451 inserted into an upper portion of each of the second through-holes 1431 of the insulating body 1430 to fix each of the respective upper contact pins 210 to the insulating body 1430.

The lower film plate 1410, the insulating body 1430, and the upper film plate 1430 are integrally formed to have a predetermined thickness and include the through-holes 1411, 1431, and 1441, respectively. The spring contacts 100 are inserted into the through-holes 1411, 1431, and 1441, and the upper contact pins 110 are fixed integrally with the insulating body 1430 by the respective first silicone caulking parts 1451. The first through-holes 1411, the second through-holes 1431, and the third through-holes 1441 have the same inner diameter. Preferably, at least the second through-holes 1431 have outer diameters larger than maximum outer diameters of the spring contacts 100 to avoid interference with the operation of the spring contacts 100 when the spring contacts 100 accommodated therein are moved upward and downward.

The first silicone caulking parts 1451 may be provided by the use of an elastic silicone rubber. The silicone caulking parts 1451 fix lower ends of the lower contact pins 220 while being compressed within the elastic range of the material of the silicone caulking parts 1451 themselves. Preferably, insertion depths of the silicone caulking parts 1451 are reached appropriately to depths of shoulder protrusions 113 of the upper contact pins 110.

Preferably, a second silicone caulking part 1452 may be inserted into a lower portion of each of the second through-holes 1431 of the insulating body 1430 and molded whereby the insulating body 1430 and the lower contact pins 120 may be fixedly supported.

The insulating body 1430 may be provided by the use of an elastomeric such as an elastic silicone rubber. In this case, the insulating body made of the elastomeric may be manufactured in such a manner that a liquid resin is injected into a separate mold and is cured. Therefore, it is easy to manufacture as compared to a conventional method of injecting synthetic resin.

The mounting part 1420 may include a mounting hole for assembling the socket and a guide hole for guiding the socket in position. A reinforcing plate 350 may be provided by the use of metal (SUS) or resin.

A first adjustment plate 1462 for height adjustment may be provided on a lower surface of the lower film plate 1410. In addition, a second adjustment plate 1462 for height adjustment may be provided on an upper surface of the upper film plate 1440.

Figure 26:
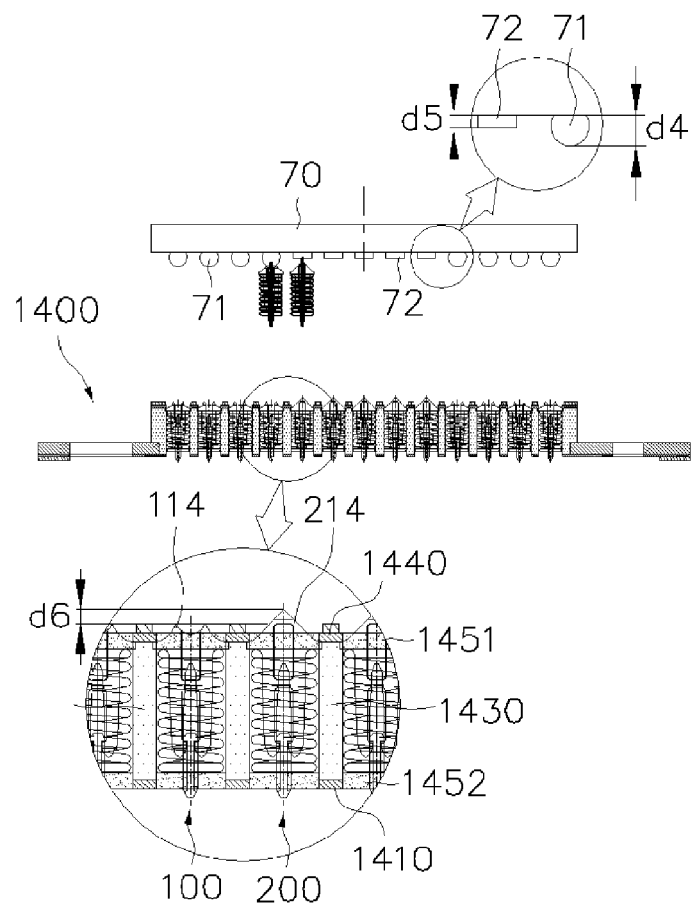

FIG. 26 illustrates a modification of the fourth embodiment of the present invention. A test socket in the present embodiment may include different spring contacts 100 and 200 to be suitable for leads of a hybrid IC in which a BGA type and a LGA type are mixed.

The hybrid IC 70 includes ball-type leads 71 and land-type leads 72 having different heights d4 and d5, and correspondingly thereto, a socket 1400 includes first spring contacts 100 and second spring contacts 200 having different heights in accordance with the type of the respective leads.

First silicone caulking parts 1451 and second silicone caulking parts 1452 are inserted into upper ends of the first spring contacts 100 and lower ends of the second spring contact 200, respectively, to be fixed to and supported by an insulating body 1430.

In the present embodiment, the first spring contacts 100 each of which includes an upper contact pin having a pair of first end contact portions 114 are provided at positions of the ball-type leads 71, while the second spring contacts 200 each of which includes an upper contact pin having one first end contact portion 214 are provided at positions of the land-type leads 72.

As described above, the spring contacts according to the present invention have a high degree of design freedom with respect to the height or shape of the first end contact portions at upper ends of the contact pins. For this reason, the socket 400 may include the different first and second spring contacts 100 and 200 having a height difference d6 so as to compensate for a height difference d4-d5 according to the lead type when the IC is loaded.

Fifth Embodiment

Figure 27:
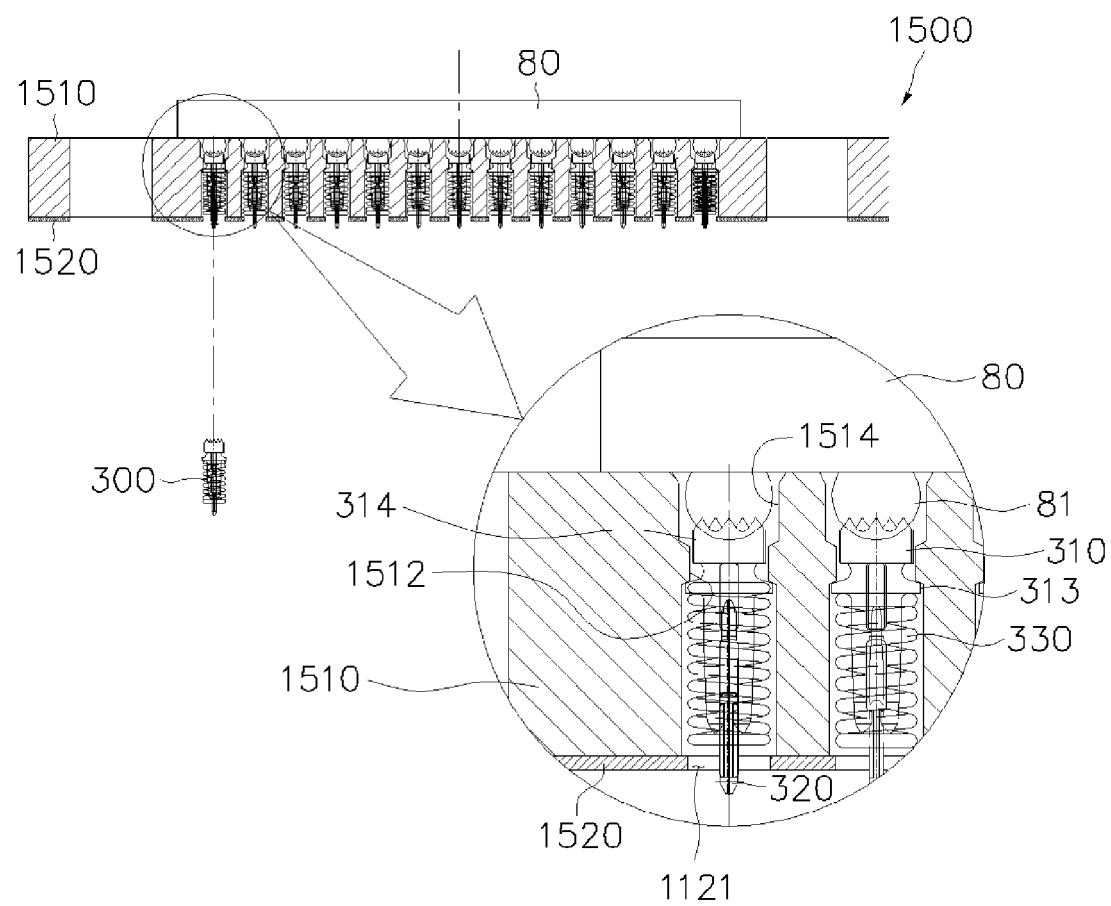
FIG. 27 is a sectional view illustrating a test socket according to a fifth embodiment of the present invention.

FIG. 27 is a sectional view illustrating a test socket according to a fifth embodiment of the present invention.

Referring to FIG. 27, a test socket 1500 of the present embodiment includes a plurality of spring contacts 300 each of which includes two contact pins 310 and 320 elastically supported by a coil spring 330 and assembled to cross each other, a main plate 1510 having a plurality of accommodating holes 1511 in which the spring contacts 300 are accommodated, and a film plate 1520 provided on a lower portion of the main plate 1510. The other configurations remain substantially the same as those of the test socket according to the first embodiment, except for the spring contacts 300.

In the present embodiment, the upper contact pin 310 of each of the spring contacts 300 includes a cylindrical head portion 314.

Each of the spring contacts 300 is accommodated in each of the accommodating holes such that shoulder protrusions 313 of the upper contact pin 310 are limited to move upward in contact with each stepped portion 1512, and shoulder protrusions (not illustrated) of the lower contact pin 320 are limited to move downward by being supported by the film plate 1520. Meanwhile, the head portion 314 of each of the respective upper contact pins 310 has a smaller inner diameter than that of the stepped portion 1512, and thus, upper ends of the respective head portions 314 of the upper contact pins 310 can be located in pocket holes 1514 to come into contact with lead balls 81.

In particular, when leads of an IC are ball-type leads, the provision of the cylindrical head portions 314 at the upper ends of the upper contact pins 310 enables more stable contact with the lead balls 81, thereby making it possible to reduce the contact resistance.

Meanwhile, in the present exemplary embodiment, the film plate 1520 is attached to a lower portion of the main plate 1510 to fix and support lower ends of the spring contacts 300. However, as described in the previous embodiments, silicone caulking parts may be directly injected into lower openings of the spring contacts to fix the lower ends of the spring contacts, without provision of a separate film plate.

Sixth Embodiment

Figure 28:
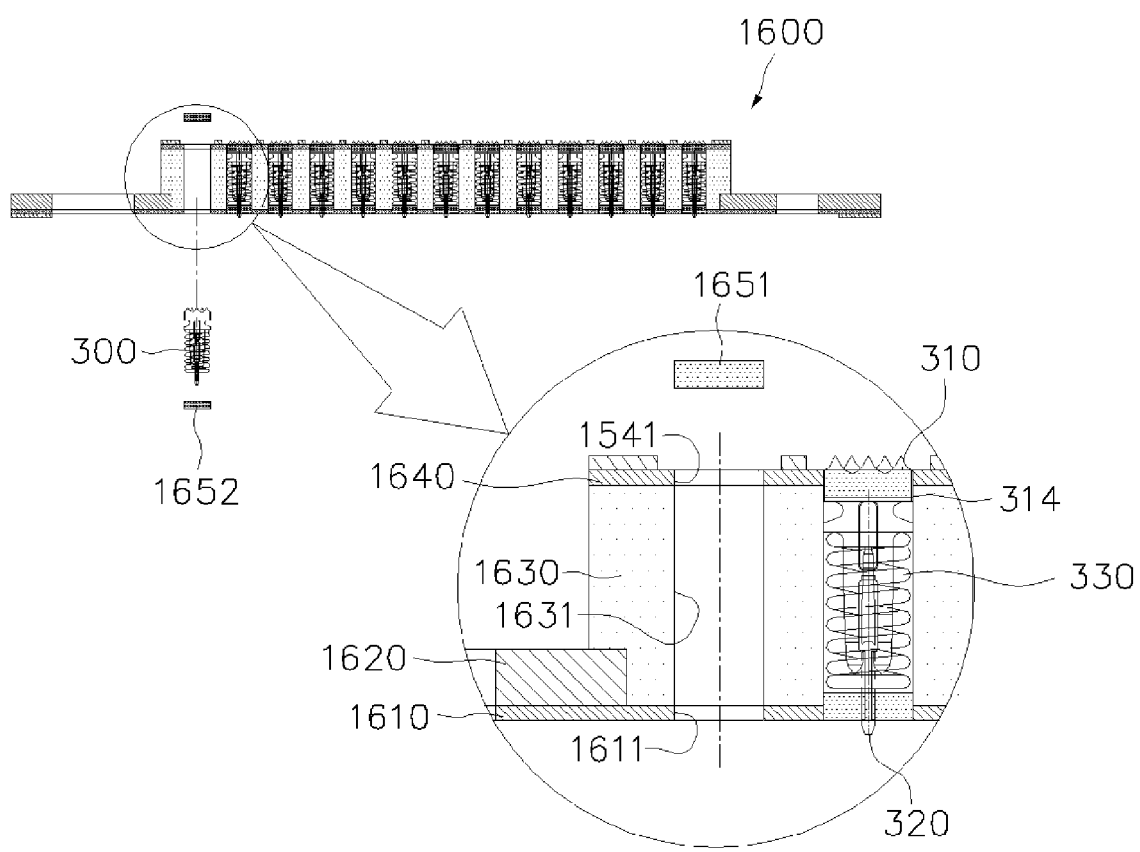
FIG. 28 is a sectional view illustrating a test socket according to a sixth embodiment of the present invention.

FIG. 28 is a sectional view illustrating a test socket according to a sixth embodiment of the present invention.

As illustrated in FIG. 28, spring contacts 300 each of which includes a cylindrical head portion 314 are applicable to the structure of the spring contacts (see FIG. 25) of the fourth embodiment described above.

In detail, a test socket 1600 of the present embodiment is configured such that first silicone caulking parts 1651 and second silicone caulking parts 1652 are injected into upper opening ends of through-holes 1611 and lower opening ends of through-holes 1631, respectively, in a state in which the spring contacts 300 are accommodated in the second through-holes 1631 of an insulating body 1630, whereby upper ends of upper contact pins 310 and lower ends of lower contact pins 320 are fixed to and supported by the insulating body 1630.

Seventh Embodiment

Figure 29:
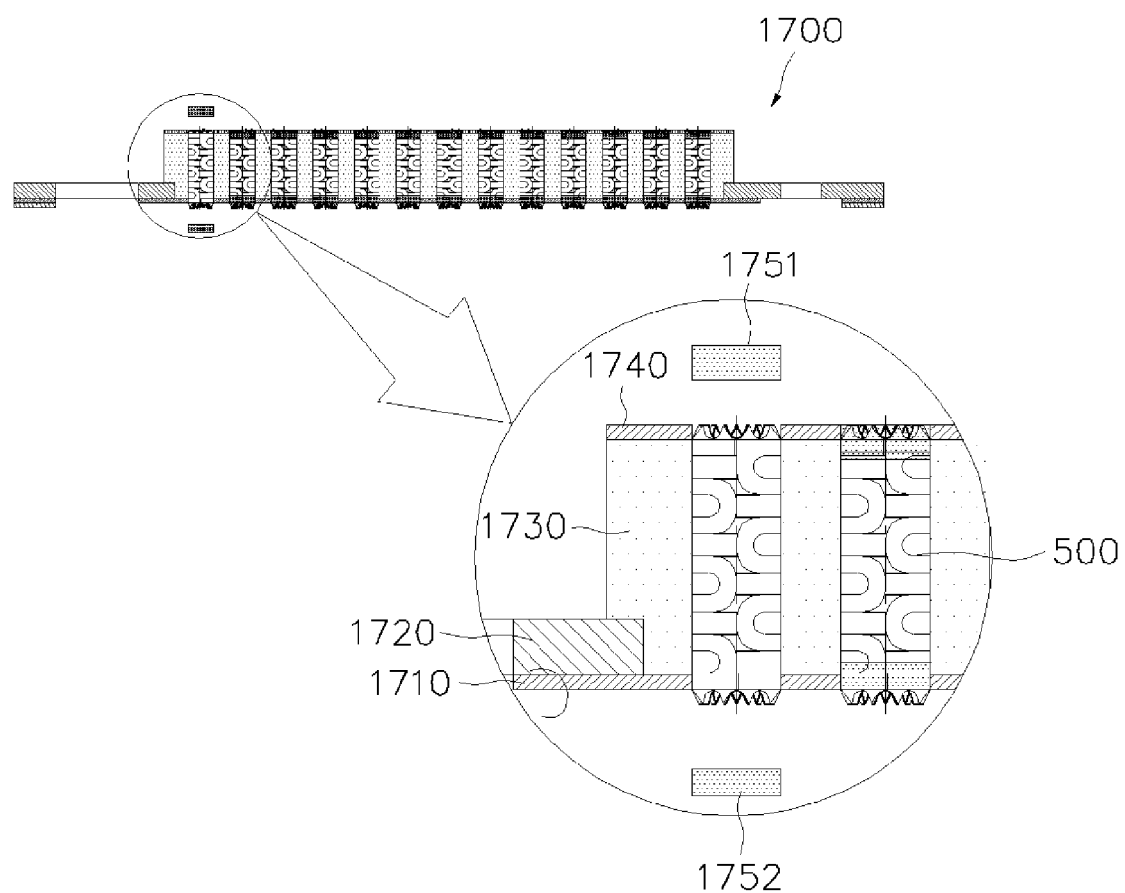
FIG. 29 is a sectional view illustrating a test socket according to a seventh embodiment of the present invention.

FIG. 29 is a sectional view illustrating a test socket according to a seventh embodiment of the present invention.

As illustrated in FIG. 29, spring contacts 500 having a structure bent in a cylindrical shape are applicable to the structure of the spring contacts (see FIG. 25) of the fourth embodiment described above.

In detail, a test socket 1700 of the present embodiment is configured such that first silicone caulking parts 1751 and second silicone caulking parts 1752 are injected into upper and lower opening ends of through-holes, respectively, in a state in which the spring contacts 500 bent in a cylindrical shape are accommodated in second through-holes of an insulating body 1730, whereby upper and lower ends of the spring contacts 500 are fixed to and supported by the insulating body 1730.

The structure of the test socket 1700 is not particularly limited as long as the spring contacts 500 have an overall cylindrical shape and intend to provide elastic force in an axial direction. For example, a double cylindrical structure described with reference to FIGS. 19A and 19B and FIGS. 20A and 20B may also be applicable in the same manner.

Although exemplary embodiments of the present invention have been described for illustrative purposes, those skilled in the art will appreciate that various modifications, additions and substitutions are possible, without departing from the scope and spirit of the invention as defined by the appended claims.

What is claimed is:

1. A spring contact, comprising:
a first contact pin; a second contact pin assembled to the first contact pin such that the first and second contact pins cross each other; and a coil spring elastically supporting the first contact pin and the second contact pin,
wherein each of the first contact pin and the second contact pin includes:
a body portion including a groove that is recessed in each of opposite surfaces thereof in a longitudinal direction thereof;
a pair of shoulder protrusions protruding from each of left and right side ends of the body portion to support the coil spring;
a first end contact portion extending from an upper end of the body portion;
a pair of elastic portions extending in the longitudinal direction of the body portion to be bilaterally symmetrical to each other, and each of which includes a guide surface protruding inward from an end portion of each of the elastic portions such that the respective guide surfaces face each other; and
a second end contact portion extending from an end of each of the elastic portions,
wherein at least one of the first end contact portion and the second end contact portion includes a head portion formed at the upper end of the body portion and made of a plate-shaped strip, the strip having same left and right lengths with respect to of a center of the body portion, with an upper end along which the first end contact portion is formed, and
the strip includes a first strip section located on the same plane as the body portion and provided to have the same left and right distances from the center of the body portion, and a second strip section rolled at each of opposite ends of the first strip section to have a semi-circular arc shape, such that the first strip section is located in a radial direction of a cylindrical shape formed by the entire second strip section.

2. The spring contact of claim 1, wherein the first and second contact pins have the same shape.

* * * * *